United States Patent [19]
Hiroki et al.

[11] Patent Number: 5,558,482
[45] Date of Patent: Sep. 24, 1996

[54] MULTI-CHAMBER SYSTEM

[75] Inventors: Tutomu Hiroki, Yamanashi-ken; Shoichi Abe; Kiyotaka Akiyama, both of Kofu, all of Japan

[73] Assignees: Tokyo Electron Limited, Tokyo; Tokyo Electron Yamanashi Limited, Nirasaki, both of Japan

[21] Appl. No.: 202,100

[22] Filed: Feb. 25, 1994

Related U.S. Application Data

[63] Continuation-in-part of Ser. No. 102,987, Jul. 28, 1993.

[30] Foreign Application Priority Data

| Jul. 29, 1992 | [JP] | Japan | 4-222128 |
| Feb. 26, 1993 | [JP] | Japan | 5-061253 |
| Feb. 26, 1993 | [JP] | Japan | 5-061295 |
| Feb. 26, 1993 | [JP] | Japan | 5-061400 |

[51] Int. Cl.$^6$ ............ B65G 65/00; B65G 49/07
[52] U.S. Cl. ............ 414/217; 414/937; 414/939; 414/941; 901/47
[58] Field of Search ............ 414/217, 282, 414/283, 416, 331, 936, 937, 939, 941; 901/47; 118/719; 204/298.25

[56] References Cited

U.S. PATENT DOCUMENTS

| 4,836,733 | 6/1989 | Hertel et al. | 414/936 X |
| 4,951,601 | 8/1990 | Maydan et al. | 414/939 X |
| 5,102,291 | 4/1992 | Hine | 414/331 X |
| 5,135,608 | 8/1992 | Okutani | 414/217 X |
| 5,306,380 | 4/1994 | Hiroki | 414/939 X |
| 5,380,137 | 1/1995 | Wada | 414/937 X |

FOREIGN PATENT DOCUMENTS

| 62-51237 | 3/1987 | Japan | 414/936 |
| 2-209331 | 8/1990 | Japan | 414/941 |
| 5-208389 | 8/1993 | Japan | 414/941 |
| 5-294405 | 11/1993 | Japan | 414/939 |
| 91-04213 | 4/1991 | WIPO | 414/217 |

*Primary Examiner*—Michael S. Huppert
*Assistant Examiner*—Stephen Gordon
*Attorney, Agent, or Firm*—Oblon, Spivak, McClelland, Maier & Neustadt, P.C.

[57] ABSTRACT

A vacuum-process system comprising plural vacuum-process chambers in which substrates are processed in decompressed atmosphere, a first load lock chamber communicated with each of the vacuum-process chambers and exhausted to substantially same decompressed atmosphere as in the vacuum-process chambers, a second load lock chamber communicated with the first one and exhausted to substantially same atmosphere as in the first load lock chamber, a first carrier arranged in the first load lock chamber to carry the substrate between the first and the second load lock chamber, a first buffer assembly arranged in the first load lock chamber to temporarily hold plural substrates thereon, a second buffer assembly arranged in the second load lock chamber to temporarily hold plural substrates thereon, an assembly in the second load lock chamber to position single or plural substrates relative to their passage, and a second carrier arranged in normal atmosphere to carry plural substrates into and out of the second load lock chamber.

14 Claims, 15 Drawing Sheets

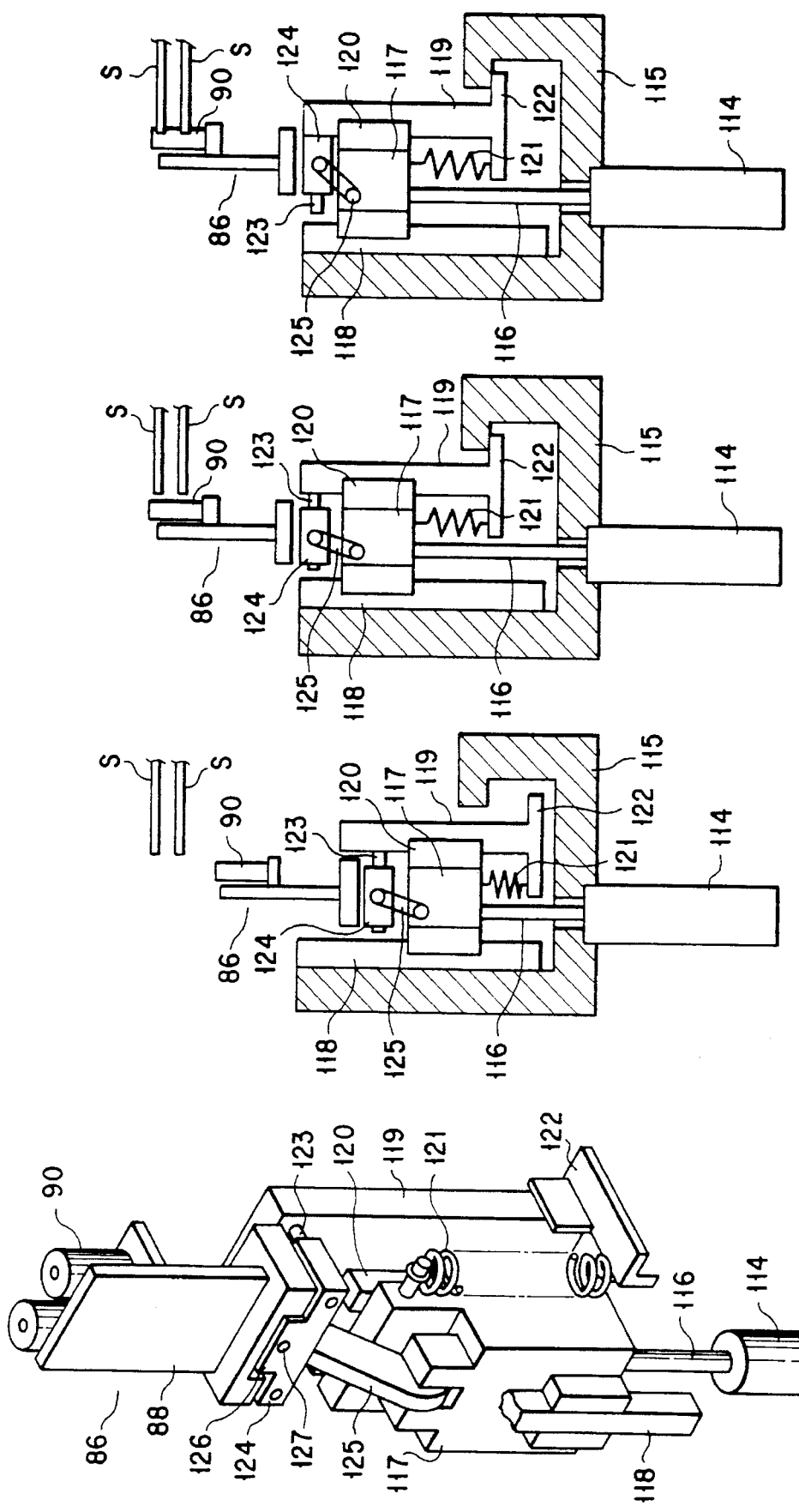

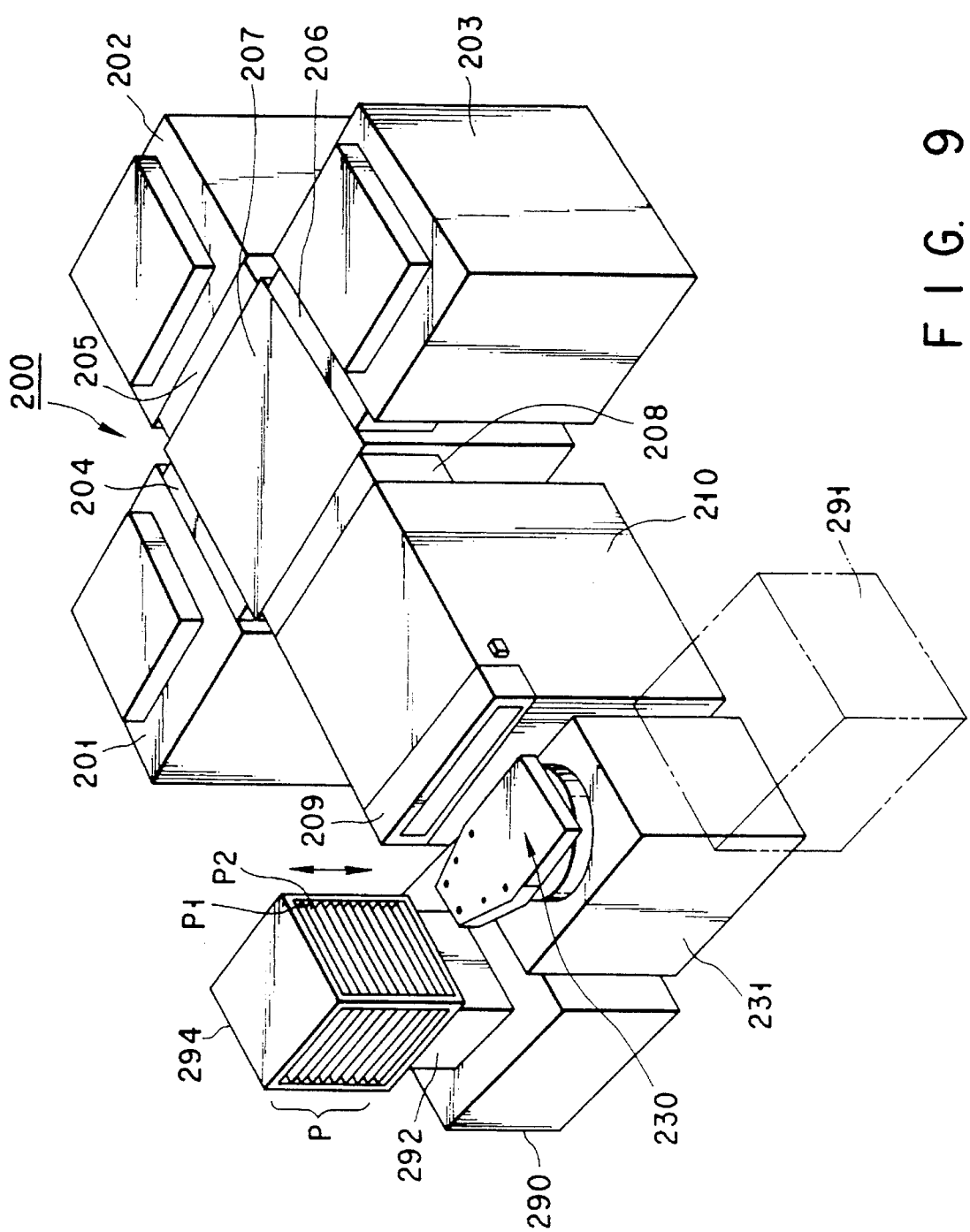

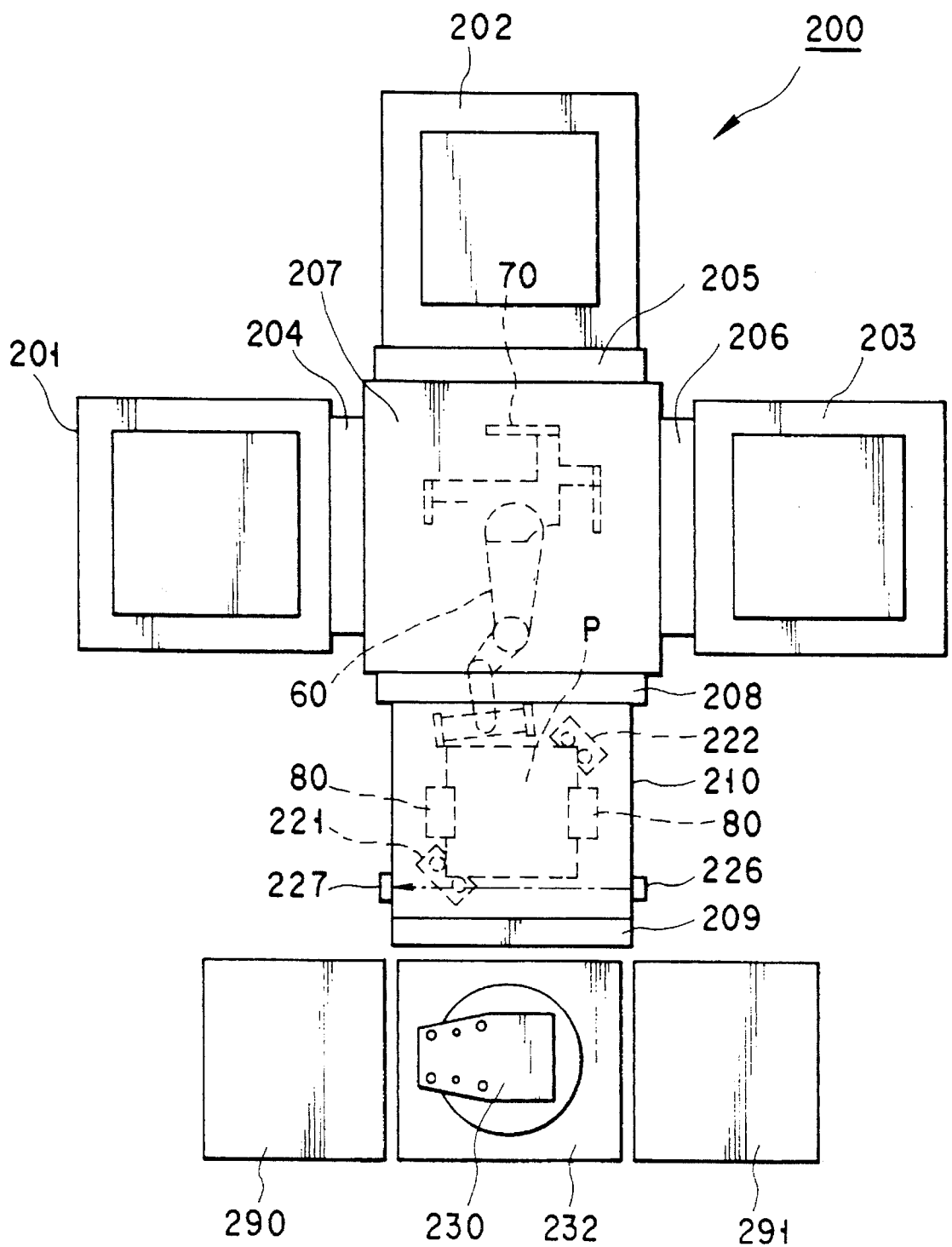
F I G. 10

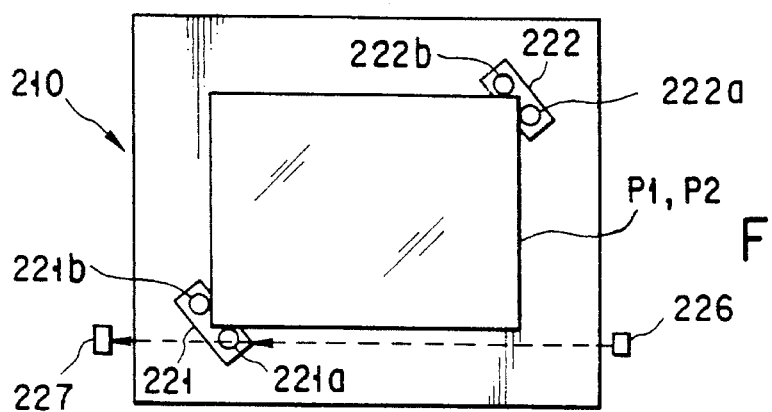
F I G. 15A
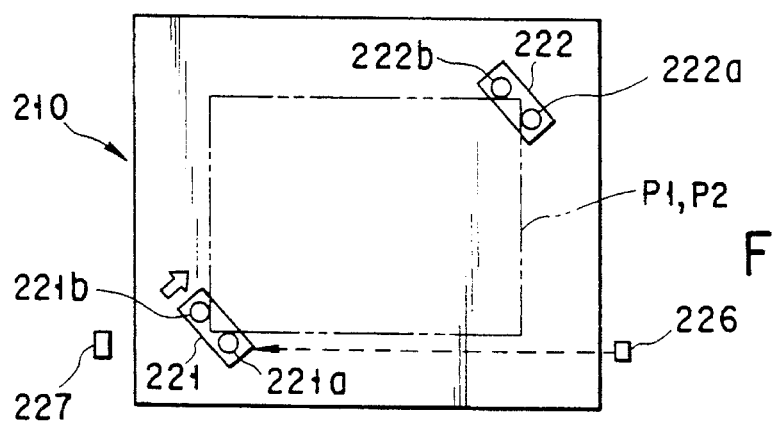
F I G. 15B
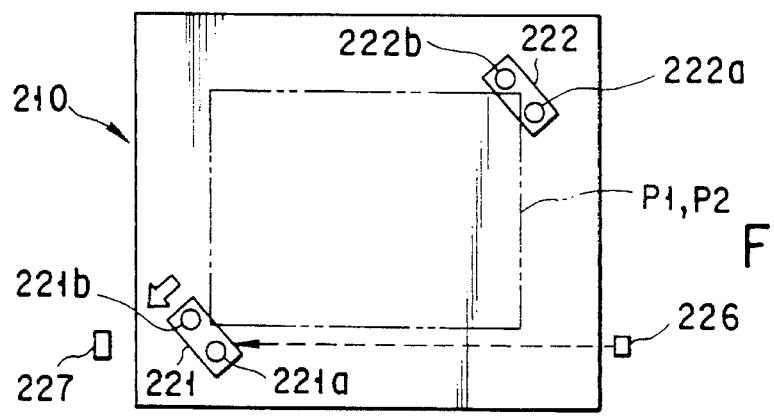
F I G. 15C

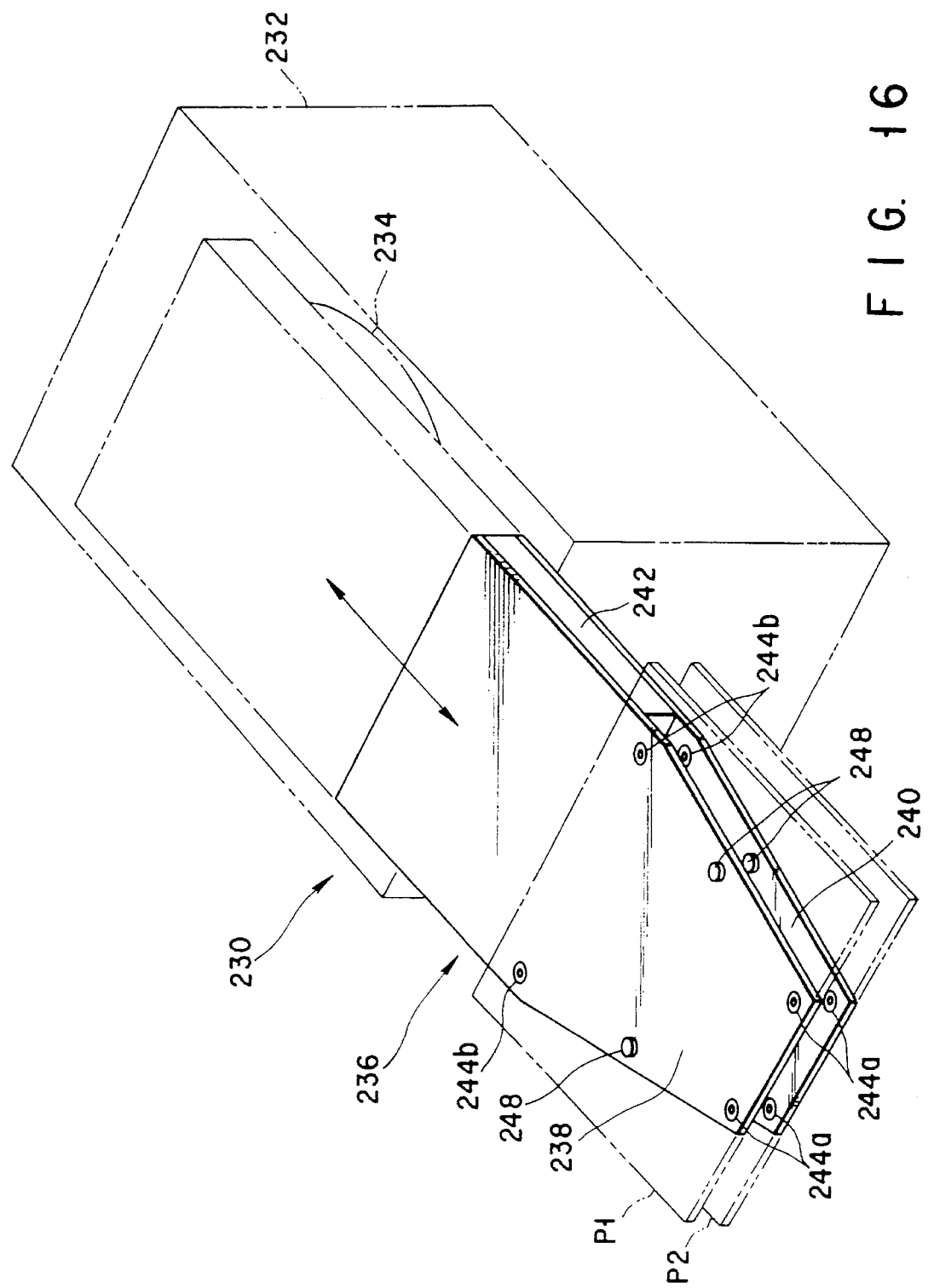
F I G. 16

MULTI-CHAMBER SYSTEM

CROSS-REFERENCE TO THE RELATED APPLICATION

This application is a continuation-in-part of U.S. patent application Ser. No. 08/102,987 filed on Jul. 28, 1993 pending.

BACKGROUND OF THE INVENTION

1. Field of the Invention

The present invention relates to a multi-chamber system for carrying substrates such as LCD glass ones (which will be hereinafter referred to as LCD substrates) out of normal into decompressed atmosphere to process them in it.

2. Description of the Related Art

The vacuum processing apparatus provided with plural process chambers in which predetermined processes such as etching and ashing are applied to semiconductor wafers and liquid crystal device (LCD) substrates has been used in the course of manufacturing semiconductor devices and LCDs.

In the case of this vacuum processing apparatus, plural or three vacuum process chambers, for example, are arranged around an auxiliary vacuum chamber (or load lock chamber) in which a substrate carrier mechanism such as the carrier arm is arranged. LCD substrates, for example, which are to be processed, are carried into and out of the process chambers by the carrier arm and predetermined processes are applied to them in these process chambers.

In the case of the vacuum processing apparatus in which LCD substrates are processed, it is an important technical problem how many sheets of substrates can be processed for a certain time or how the throughput of the apparatus can be enhanced. In addition, LCDs have been used as display devices for large-sized computers and televisions and they therefore become larger and larger in size for this purpose. As they become larger in size, however, the productivity of LCD substrates is reduced and the manufacturing cost per an LCD substrate is increased to a greater extent.

One of cases which reduce the productivity as described above resides in that contamination is caused by contaminating matters such as particles in the apparatus. In addition, the shifting of LCD substrates from their predetermined positions is another cause. When they are shifted from their predetermined positions, they are dropped down and damaged while they are being carried, or the uniformity of process applied to them is degraded. The productivity is thus reduced. Particularly when they become larger in size, they are more likely to be moved by the vacuum-making exhaust of the load lock chamber, for example. They are thus shifted from their predetermined positions.

Further, LCD substrates are various in size and processes applied to these LCD substrates are also various. The vacuum processing apparatus, therefore, must be made more flexible to meet these various sizes and processes.

The detecting of LCD substrates in the load lock chamber is conventionally conducted in such a way that detecting beam is shot from a photosensor directly to the LCD substrates in the load lock chamber and that beam reflected from the substrates is received by the photosensor. According to this substrates detecting system, however, the reflection factor of beam is greatly influenced by the surface condition of each substrate. The detecting accuracy of this system is therefore low. The sensibility of the photosensor is adjusted every LCD substrate in this case, but it takes a large amount of time and effort because each LCD substrate is made of transparent glass.

Further, the photosensor is arranged together with the LCD substrates in a same chamber. The LCD substrates are thus influenced by heat emitted from the photosensor, or bad influence is added to the substrates in the case of sensor trouble. When the sensor is arranged in the load lock chamber, free space in it must be reduced or it must be made larger in size.

The substrates-carrying arm mechanism is arranged adjacent to an opening of the load lock chamber through which the substrates are carried into and out of the load lock chamber. Suction holes are formed in the top of each holder member of the carrier arm mechanism and an O-ring is attached to each of these suction holes. When the substrate is vacuum-sucked on each holder member through the suction holes, it is closely contacted with the O-rings on each holder member along its side rims. Friction and suction forces thus created can prevent each substrate from being positionally shifted on the holder member.

However, the conventional O-rings are made of silicon rubber of fluorine-contained rubber, for example, and when the close contact of the substrate with the O-rings is repeated, particles are caused from the O-rings and they adhere to the substrate.

Further, the LCD substrates (each being about 1 mm thick) tend to be made larger, having a size of 450 mm×500 mm. When they are held on the holder members, therefore, they bend downward at their center portions because of their own weight. This prevents each substrate from being fully contacted with the O-rings on each holder member along its side rims. The O-rings, sometimes, cannot suck the substrate on the holder member. Particularly when the O-rings are made of hard material, it becomes difficult that the O-rings can vacuum-suck the substrate firmly on the holder member.

SUMMARY OF THE INVENTION

An object of the present invention is therefore to increase the throughput of the vacuum processing apparatus to a greater extent.

Another object of the present invention is to enhance the flexibility of the vacuum processing apparatus to a higher extent.

A further object of the present invention is to provide a vacuum-process system capable of more reliably carrying LCD substrates between process chambers while keeping them correctly positioned relative to their passage in the system.

According to the present invention, there can be provided a multi-chamber system comprising plural vacuum-process chambers in which substrates are processed in decompressed atmosphere; a first load lock chamber communicated with each of the vacuum-process chambers and exhausted to substantially same decompressed atmosphere as in the vacuum-process chambers; a second load lock chamber communicated with the first load lock chamber and exhausted to substantially same atmosphere as in the first load lock chamber; first carrier means arranged in the first load lock chamber to carry the substrate between the first load lock chamber and the second load lock chamber; first buffer means arranged in the first load lock chamber to temporarily hold plural substrates thereon; second buffer means arranged in the second load lock chamber to temporarily hold plural substrates thereon; positioning means arranged in the second load lock chamber to position single or plural substrates relative to their passage; and second carrier means arranged in atmosphere to carry plural substrates into and out of the second load lock chamber.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a perspective view showing a mechanism for driving each positioner shown in FIG. 3;

FIGS. 5A through 5C show how each positioner is driven by the drive mechanism shown in FIG. 4;

FIG. 9 is a perspective view schematically showing the whole of a multi-chamber system according to the present invention;

FIG. 10 is a plan view schematically showing the whole of the multi-chamber system;

FIGS. 15A through 15C are plan views intended to explain how substrates are positioned in the second load lock chamber;

FIG. 16 is a perspective view showing another carrier arm;

DETAILED DESCRIPTION OF THE PREFERRED EMBODIMENTS

The present invention will be described in detail, citing an embodiment shown in the accompanying drawings. The present invention is applied, in this case, to the vacuum processing apparatus in which etching, ashing and so forth are applied to LCD substrates.

Figure 1:
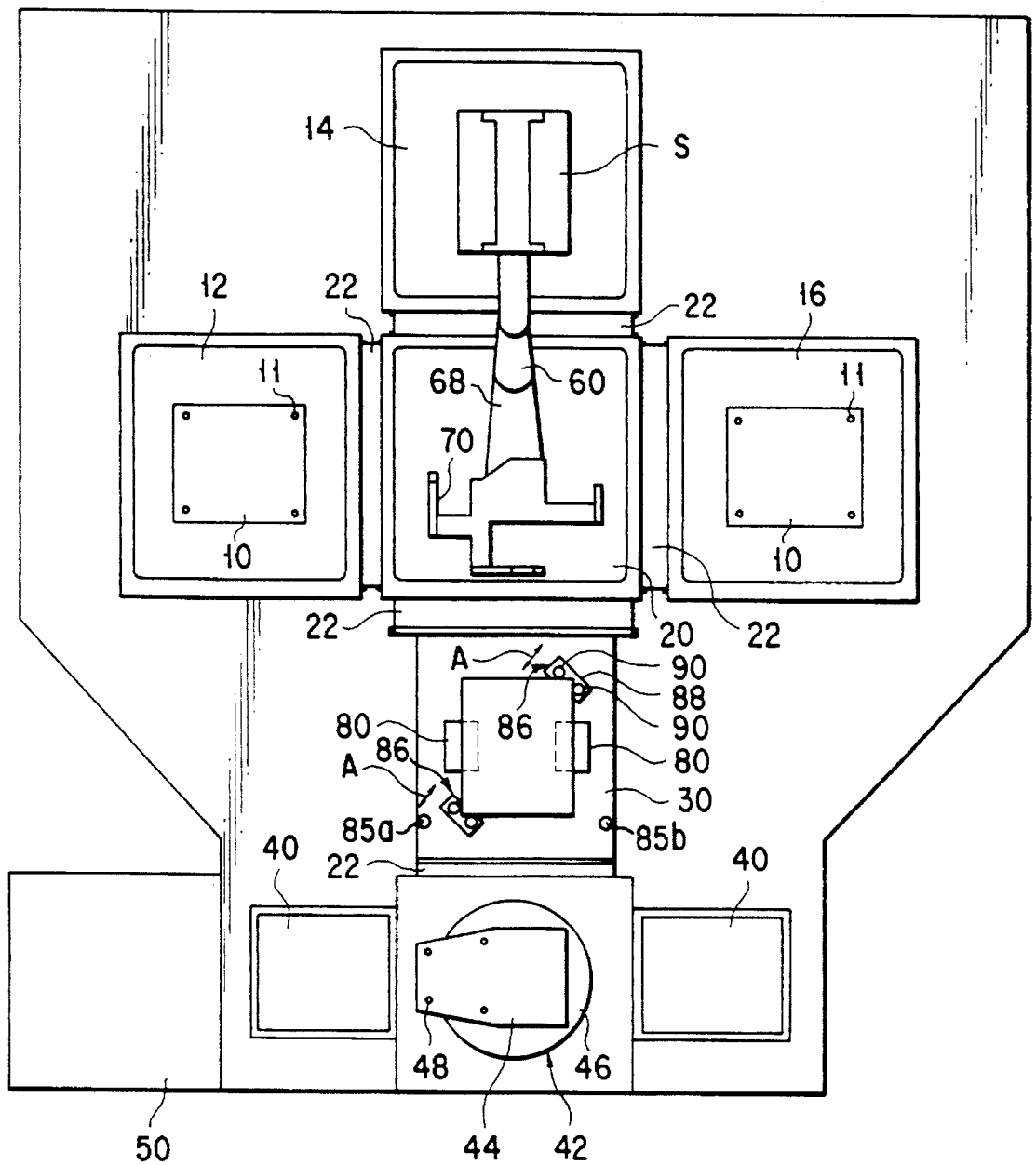
FIG. 1 is a plan view schematically showing the vacuum processing apparatus according to an embodiment of the present invention.

In the case of the vacuum processing apparatus according to an embodiment of the present invention shown in FIG. 1, a first load lock chamber (or auxiliary vacuum chamber) 20 and a second load lock chamber 30 are arranged side by side. Plural or three vacuum process chambers, that is first, second and third vacuum process chambers 12, 14 and 16 are arranged adjacent to the remaining three sides of the first load lock chamber 20. Gate valves 22 are interposed between the first 20 and the second load lock chamber 30 and between the first load lock chamber 20 and each of the process chambers 12, 14 and 16. A gate valve 22 is also attached to that opening of the second load lock chamber 30 through which the second load lock chamber 30 is communicated with outside. These gate valves 22 are opened and closed, serving to air-tightly seal their corresponding passages when closed.

A mount 10 on which an LCD substrate S is mounted is arranged in each of the process chambers 12, 14 and 16. Each mount 10 includes four lifting pins 11 for supporting the substrate S.

A carrier member 42 is arranged under atmospheric pressure outside the second load lock chamber 30 (or below the second load lock chamber 30 in FIG. 1). Lifting tables (not shown) on which LCD substrates-housed cassettes 40 are mounted are arranged on both sides of the carrier member 42. FIG. 1 shows the cassettes 40 mounted on their corresponding lifting tables. Substrates which will be processed are housed in one of the cassettes' 40 and those which have been processed are housed in the other.

The carrier member 42 includes two arms 44 piled one upon the other, and a base 46 for supporting these arms 40 to be advanced, retreated and rotated together. Four projections 48 are projected from the top of each arm 40 to support the substrate S thereon. Each projection 48 is a resilient matter made of synthetic rubber and having a high friction factor. The substrate S supported on these projections 48 of each arm 44 can be thus prevented from shifting from its predetermined position on each arm 44 or dropping down from it. The carrier member 42 can carry two sheets of substrates at once by its two arms 44. In short, two sheets of substrates can be carried into and out of each cassette 40 by the carrier member 42. The level of each cassette 40 can be adjusted to a substrate carrying-in or -out position by the lifting table.

It is preferable that the two arms 44 of the carrier member 42 have such a distance between them as can meet any of cassettes of various kinds which have various own substrate-supporting intervals. More specifically, the distance is set between the two arms 44 such that the arms 44 can be inserted between the substrates in any of the cassettes of various kinds. In addition, it is also set larger than the maximum value of the substrate-supporting intervals of the various cassettes. The carrier member 42 can thus meet any cassettes which have various substrate-supporting intervals. The vacuum processing apparatus is thus made more flexible.

A cassette may be arranged only on one side of the carrier member 42. Those substrates which have been processed would be successively returned, in this case, into empty spaces in the cassette.

A CRT (or cathode ray tube) 50 is arranged on one side of the carrier member 42 with the cassette-mounted table interposed between them to monitor how the processing of each substrate is controlled in the vacuum processing apparatus.

Figure 2:
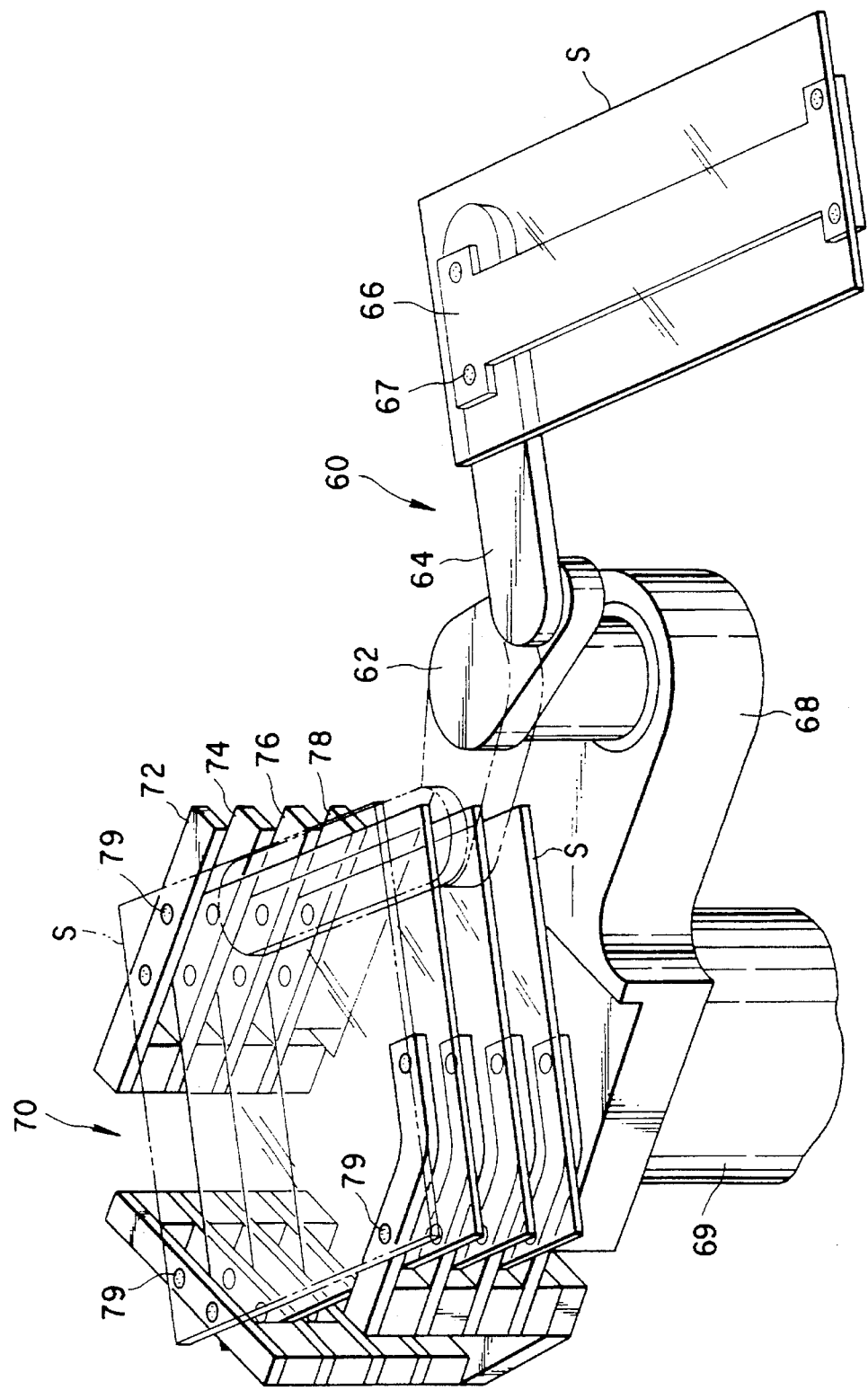
FIG. 2 is a perspective view showing a carrier arm and a buffer frame arranged in a first load lock chamber of the apparatus shown in FIG. 1.

As shown in FIG. 2, a carrier arm 60 and a buffer frame 70 arranged capable of holding plural sheets of LCD substrates are arranged in the first load lock chamber 20. Substrates are carried in and out between the first load lock chamber 20 and each of the vacuum process chambers 12, 14 and 16 by the carrier arm 60. The buffer frame 70 is used to temporarily hold processed or unprocessed LCD substrates therein to increase the throughput of processes conducted.

The buffer frame 70 is located at one end of a rotatable base 68 and arranged movable up and down relative to the base 68. It includes plural or four buffers, that is, first, second, third and fourth buffers 72, 74, 76 and 78 to form four horizontal LCD substrate support levels. Its each level has protrusions 79 on which the substrate is supported, and these protrusions 79 are resilient matters made of synthetic rubber and having a high friction factor. And they serve to prevent the substrate thereon from shifting from its predetermined position on each level or dropping down from each level.

The carrier arm 60 is located at the other end of the base 68. It includes first, second and third swingable arm elements 62, 64 and 66 and it can be thus made extensible. The third arm element 66 is shaped like a letter I, as shown in FIG. 2, and it has those protrusions 67 at its sideward-extended portions on which the substrate S is supported. These protrusions 67 are resilient matters made of synthetic rubber and having a high friction factor and they serve to prevent the substrate S thereon from shifting from its predetermined position on the third arm element 66 or dropping down from the element 66.

The carrier arm 60 and the buffer frame 70 are rotated together round a cylinder 69. When the base 68 is rotated, the arm 60 is selectively faced one of the vaccum process chambers 12, 14, 16 and the second load lock chamber 30.

The carrier mechanism provided with the carrier arm 60 and the buffer frame 70 is substantially the same as the one disclosed in the co-pending U.S. patent application Ser. No. 08/053,389 filed on Apr. 28, 1993 now Pat. No. 5,306,380 by the same Applicant, the teachings of which are hereby incorporated by reference.

A buffer rack 80 having a pair of stands 81 to support LCD substrates thereon is arranged in the second load lock chamber 30. It serves to temporarily hold two sheets of LCD substrates S together in the second load lock chamber 30. The vacuum-making and purging efficiency in the second load lock chamber 30 can be enhanced by transferring two sheets of LCD substrates S at a time into the second load lock chamber 30 by the arms 44.

The rack 80 has two buffers, that is, fifth and sixth buffers 82 and 84 (see, e.g., FIGS.3 and 13), by which two horizontal substrate support levels are formed to correspond the two arms 44 of the carrier member 42 located in atmosphere. The distance which is present between the two levels of the rack 80 is set larger than the substrate-supporting intervals of the cassettes 40. Each level of the rack 80 has protrusions 83 on which the substrate S is supported. These protrusions 83 are resilient matters made of synthetic rubber and having a higher friction factor and they serve to prevent the substrate S thereon from shifting from its predetermined position on each level or dropping down from the level. The stands 81 of the buffer rack 80 are moved together up and down. When the buffer rack 80 is moved up and down in this manner, one of the two substrates S supported on the rack 80 can be selectively carried out by the carrier arm 60 without moving the arm 60 up and down in the first load lock chamber 20.

A pair of positioners 86 are arranged in the second load lock chamber 30 to align two substrates together at a time. An optical sensor comprising an emitter 85a and a receiver 85b is also arranged in the second load lock chamber 30 to confirm that the alignment of two substrates is finished.

The positioners 86 are opposed to each other on a diagonal line of the substrate. Each positioner 86 has a base 88 movable in directions shown by arrows A in FIG. 1, and a pair of rollers 90 freely rotatably supported by the base 88. The positioners 86 align the two substrates on the rack 80 while sandwiching these substrates between them in the diagonal direction of the substrates. The rollers 90 are particularly suitable for positioning the rectangle-shaped substrates while pushing sides of each substrate at four points. They are detachably attached to the bases 88 and can be exchanged with new ones, depending upon the dimensions of LCD substrates which are to be processed.

An opening is formed in the front roller 90 of the positioner 86 to be aligned with the emitter 85a and receiver 85b. The optical sensor detects the alignment of the substrate when light emitted from the emitter 85a passes through the opening in the front roller 90 and reaches the receiver 85b.

FIG. 4 shows a mechanism for driving the positioners 86 and FIGS. 5A through 5C show how the drive mechanism is operated.

Each positioner 86 is driven by a drive source or an air cylinder 114 fixed to a casing 115. A block 117 is fixed to a drive shaft 116 of the air cylinder 114 and guided up and down by a linear guide 118 attached to the casing 115.

A plate 119 is engaged with the block 117 and guided up and down by linear guides 120 attached to the block 117. A spring 121 is interposed between the block 117 and the plate 119 and when the block 117 is moved up, therefore, the plate 119 is pulled up by the block 117.

A stopper 122 is fixed to the bottom of the plate 119. When the stopper 122 is contacted with a sideward-projected portion of the casing 115, as shown in FIG. 5B, the upward moving of the plate 119 is stopped, thereby allowing only the block 117 to be moved upward along the linear guides 120 while stretching the spring 121.

A slider 124 is engaged with the plate 119 to freely slide along linear guides 123 attached to the plate 119 in a horizontal direction (or in a direction in which the LCD substrates S are pushed). The slider 124 is connected to the block 117 through a link 125. When only the block 117 is further moved upward from its position shown in FIG. 5B and the space between the slider 124 and the block 117 is thus made narrower, the slider 124 is moved in the horizontal direction by the link 125. as shown in FIG. 5C.

As shown in FIG. 4, a linear guide 126 is formed on the top of the slider 124 and the base 88 of each positioner 86 is engaged, movable in the horizontal direction, with this linear guide 126. A spring 127 is interposed between the slider 124 and the base 88. When the bases 88 are moved to push the LCD substrates S by their rollers 90, therefore, the springs 127 can prevent excessive load from being added to the substrates S.

It may be arranged that both of two positioners 86 are moved in the diagonal direction of the substrates or that one of them is moved while fixing the other in the direction.

It will be described how the above-described vacuum processing apparatus according to an embodiment of the present invention is operated.

The two arms 44 of the carrier member 42 are driven to carry two substrates S, which are to be processed, together out of the left cassette 40 in FIG. 1. They are then turned by about 90° by the base 46 to carry the two substrates S together into the second load lock chamber 30. The distance between the two substrates S is set larger than the maximum value of the substrate-supporting intervals in any of various cassettes. This enables the arms 44 of the carrier member 42 to handle any of cassettes different in kind.

The two substrates S are held by fifth and sixth buffers 82 and 84 of the buffer rack 80 and after the arms 44 are retreated, that gate valve 22 of the second load lock chamber 30 which is located on atmospheric side is closed. The second load lock chamber 30 is then exhausted to a predetermined vacuum or about $10^{-1}$ Torr. The substrates S are positioned while pushing them by the four rollers of the paired positioners 86.

As described above, the positioning of the substrates is carried out in this vacuum processing apparatus after the second load lock chamber 30 is made vacuum. Even if the substrates S are fanned by the flow of atmosphere caused at the vaccum-making time and thus moved from their predetermined positions, therefore, this shift of them can be effectively corrected. In a case where the substrates are large in size and likely to be fanned by the flow of atmosphere, therefore, this is quite effective for preventing them from shifting from their predetermined positions. The positioning of the substrates may be carried out at least before they are carried into the first load lock chamber 20. It may be arranged, for example, that their alignment is carried out before the second load lock chamber 30 is made vacuum, that they are kept pushed by the rollers 90 while the chamber 30 is being made vacuum, and that they are released from the rollers 90 after the chamber 30 is made vacuum. When arranged in this manner, they can be prevented from being moved by the flow of atmosphere, thus dropped and damaged when the chamber 30 is being made vacuum. The positioners 86 are arranged in the second load lock chamber 30 in the above-described vacuum processing apparatus and this is because the second load lock chamber 30 is made vacuum from atmospheric pressure and the substrates are thus more likely to be fanned by the flow of atmosphere in the chamber 30 than in the first load lock chamber 20.

After the gate valve 22 between the first 20 and the second load lock chamber 30 is opened, the substrates which have been positioned as described above are carried into the first load lock chamber 20 by the carrier arm 60. The substrates S are supported on the buffer rack 80 in this case, having a predetermined distance between them. In the vacuum processing apparatus according to the present invention, the cassettes 40, whose substrate-supporting intervals may be various, depending on every cassette, are located under atmospheric pressure, and the buffer rack 80, which can hold the substrates S with a certain distance, is arranged in the second load lock chamber 30. The operation control of the carrier arm 60 can be thus achieved without depending upon the substrate-supporting intervals of the cassette 40. In short, the carrier arm 60 does not need any complicated control means by which its operation is controlled to meet any of cassettes whose substrate-supporting intervals are various and this enables the flexibility of the apparatus to be enhanced to a greater extent. The carrier arm 60 is arranged particularly in the load lock chamber. When no complicated control means is needed, therefore, it is quite useful for reducing contamination in the apparatus.

The substrates S carried into the first load lock chamber 20 as described above are etching-or ashing-processed according to an operation routine shown in FIGS. 8A through 8J.

Figure 8A:
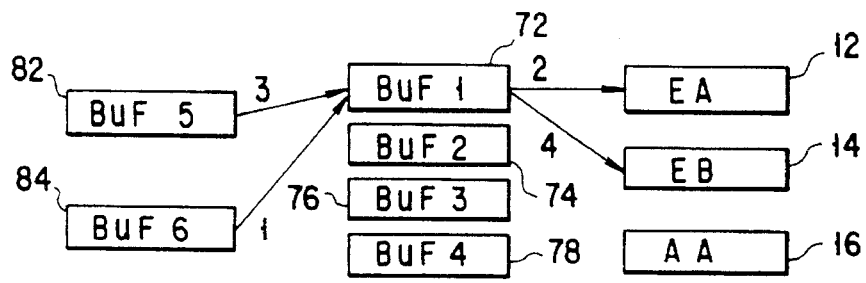
FIGS. 8A through 8J show how substrates are carried in the apparatus shown in FIG. 1.

As shown In FIG. 8A, the substrate S-1 held on the sixth buffer 84 (BUF 6) is carried into the first load lock chamber 20 and held on the first buffer 72 (BUF 1) and the gate valve 22 between the first 20 and the second load lock chamber 30 is closed (see an arrow 1). The reason why the substrate S-1 is picked up not from the fifth buffer 82 (BUF 5) but from the BUF 6 is that the other substrate S-2 which is located above the one S-1 can be effectively prevented from being contaminated even if the substrate S-1 is contacted with any of mechanical components and contaminating matters such as particles are thus caused when the substrate S-1 is being carried. The reason why the unprocessed substrate S-1 is held on the uppermost BUF 1 is that it may be contaminated by contaminating matters caused by the other now-processing or processed substrate when this now-processing or processed substrate is located above it.

The first load lock chamber 20 is then made vaccum to $10^{-4}$ Torr. This enables process contamination to be reduced in the apparatus. The gate valve 22 located on the side of the first vaccum process chamber 12 is opened and the substrate S-1 on the BUF 1 is carried into the chamber 12 (EA) (see an arrow 2) where etching process is applied to the substrate S-1. The other substrate S-2 held on the BUF 5 is similarly carried into the second vacuum process chamber 14 (EB) (see arrows 3 and 4) where etching process is applied to the substrate S-2. While etching the substrates S-1 and S-2, new unprocessed substrates S-3 and S-4 are carried from the cassette 40 and held on the BUFs 5 and 6.

Figure 8B:
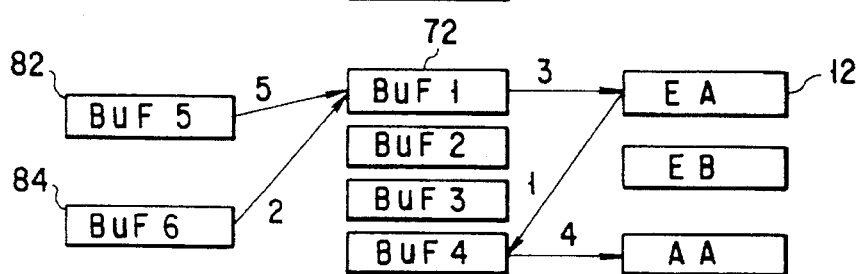

As shown in FIG. 8B, the substrate S-1 which has been etched in the EA is held on the fourth buffer 78 (BUF 4) (see an arrow 1). In order to reduce process contamination as described above, the processed substrate S-1 is held on the lowermost buffer (BUF 4) in the vacuum processing apparatus according to the present invention. The substrate S-3 held on the BUF 6 is then carried into the EA (see arrows 2 and 3) where it is etching-processed. The substrate S-1 on the BUF 4 is carried into the third vaccum processing chamber 16 (AA) (see an arrow 4) where it is ashing-processed. The reason why the etched substrate S-1 is carried into the AA after the unprocessed substrate S-3 on the BUF 6 is carried into the EA resides in that the time of etching process (two minutes, for example) is usually longer than the time of ashing process (one minute, for example). When the buffer frame 70 is made to have plural substrate support levels as seen in the vacuum processing apparatus according to the present invention, the processes can be made more efficient and their throughput can be enhanced to a greater extent as described above. The substrate S-4 on the BUF 5 is then carried onto BUF 1 (see an arrow 5) and new unprocessed substrates S-5 and S-6 are held on BUFs 5 and 6.

Figure 8C:
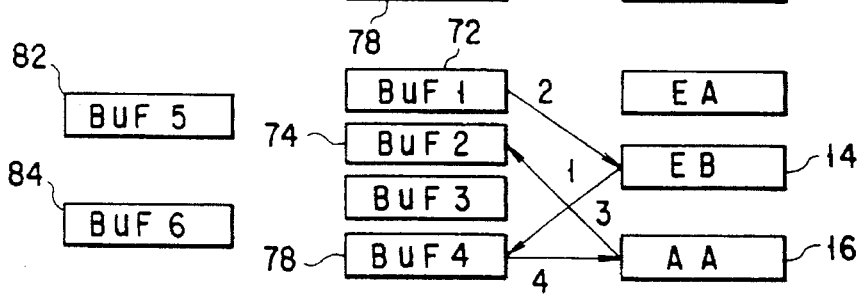

As shown in FIG. 8C, the substrate S-2 which has been processed in the EB is carried onto the BUF 4 (see an arrow 1) and the substrate S 4 on the BUF 1 is then carried into the EB (see an arrow 2) while keeping the gate valve 22 open. The substrate S-1 which has been ashing-processed in the AA is carried onto the BUF 2 (see an arrow 3) and the substrate S-2 on the BUF 4 is carried into the AA while similarly keeping the gate valve 22 open (see an arrow 4). As described above, the vacuum processing apparatus includes plural buffers, that is, the BUF 1 on which the unprocessed substrate is held, the BUF 4 on which the etched substrate is held, and the BUFs 2 and 3 on which the ashed substrates are held. The processed and unprocessed substrates can be therefore successively carried out and in one of the process chambers while leaving the gate valve open. This enables the throughput of processes to be enhanced to a greater extent. Further, process contamination can be reduced to a greater extent and the productivity of substrates can be thus enhanced because the unprocessed substrate is held above the processed one in the vacuum processing apparatus.

Figure 8D:
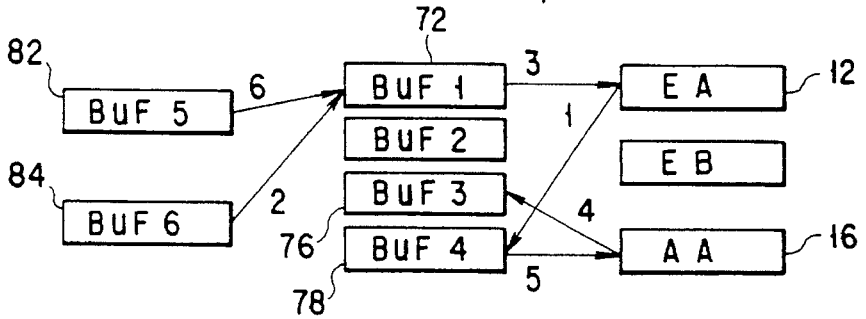

As shown in FIG. 8D, the ashing process of the substrate S-2 is finished after the substrate S-2 is processed in the order of arrows 1, 2, 3, 4, 5 and 6, and the processing of the new substrates S-5 and S-6 is started.

Figure 8E:
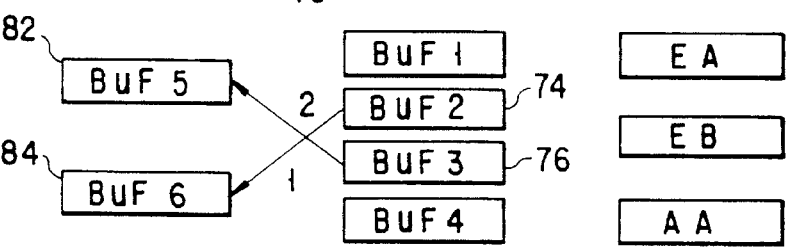
Figure 8F:
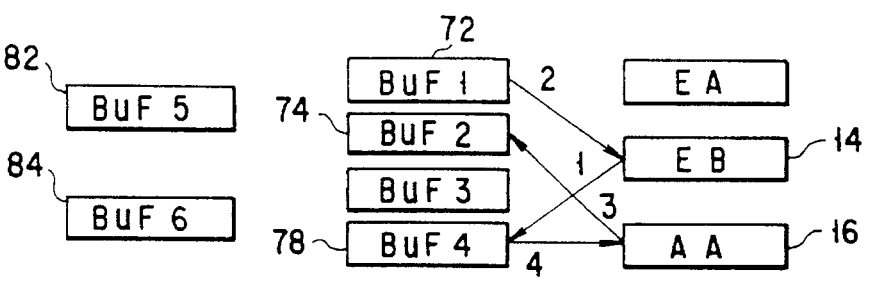
Figure 8G:
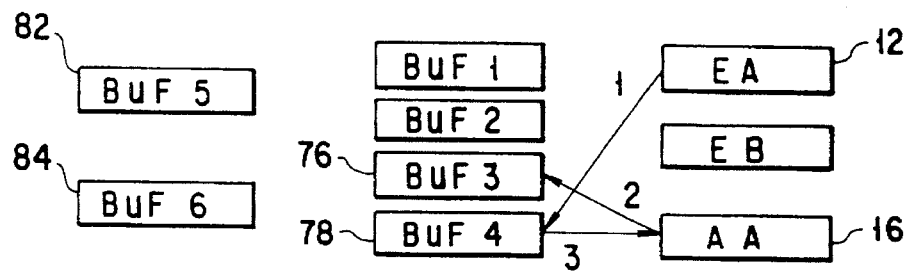
Figure 8H:
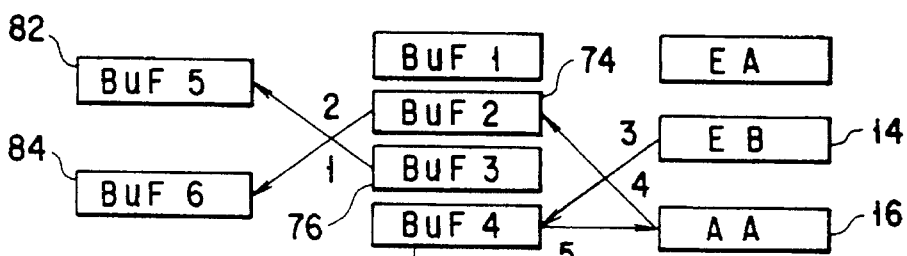
Figure 8I:
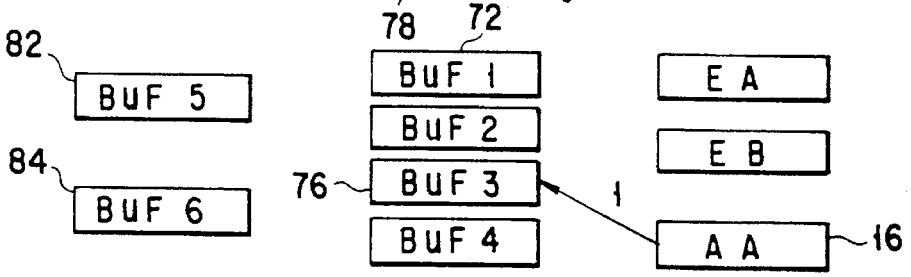
Figure 8J:
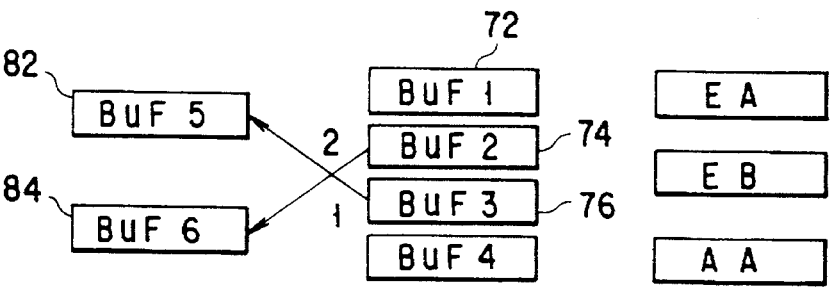

As shown in FIG. 8E, the substrates S-1 and S-2 are carried onto the BUFs 6 and 5. In order also to prevent the substrates from being contaminated in this case, the substrate S-2 is carried out of the lower BUF 3 and onto the upper BUF 5 (see an arrow 1) and the substrate S-1 is then carried out of the upper BUF 2 and onto the lower BUF 6 (see an arrow 2). They are thereafter carried into the right cassette 40 in FIG. 1.

The substrates S-3, S-4, S-5 and so on are successively processed following arrows 1, 2, 3, 4 and 5 in FIGS. 8F through 8J. Fourteen sheets of substrates, for example, housed in the left cassette 40 in FIG. 1 are processed in the same manner and the operation routine is thus finished in the vacuum processing apparatus.

According to the vacuum processing apparatus, the operation routine can be more efficiently achieved in such a way that 500 sheets of LCD substrates per a day are successively etched and ashed. Further, process contamination can be reduced and the productivity of substrates can be enhanced although the throughput of processes is much higher.

According to the vaccum processing apparatus, etching and ashing processes, the single process of etching or other various processes can be successively achieved to meet any needs of users when the control program is changed. The vacuum processing apparatus can be thus made much more flexible.

Figures 6A, 6B:
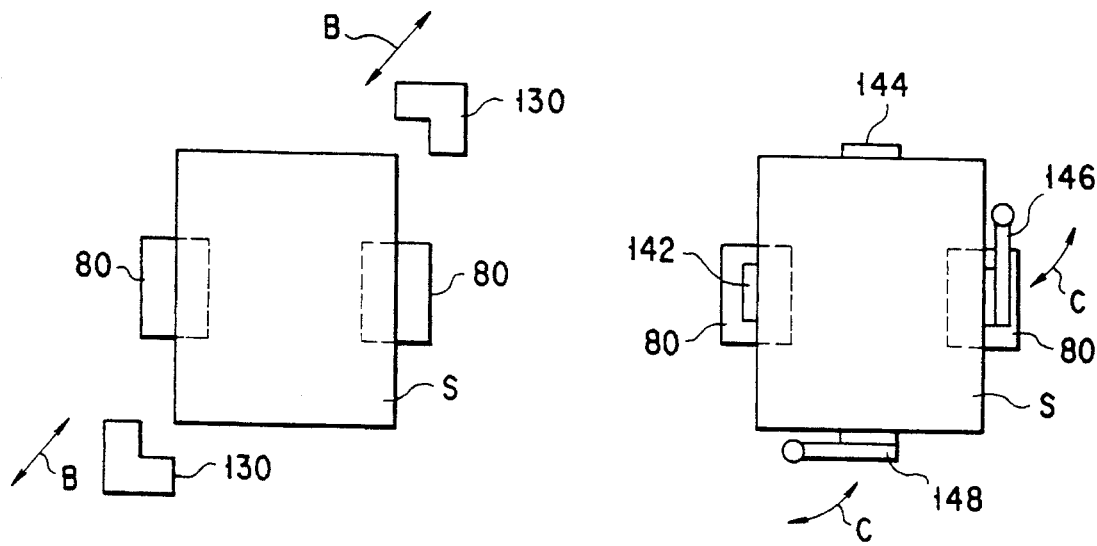
FIGS. 6A and 6B are plan views showing variations of the positioner.

It should be understood that the present invention is not limited to the above described apparatus and that various changes and modifications can be made without departing from the spirit and scope of the present invention.

variations shown in FIGS. 6A and 6B, for example, can be used as the positioners in the second load lock chamber 30 to position both of two substrates.

In FIG. 6A, a pair of positioners 130 are made freely movable in relation to the substrates and in the diagonal direction of the substrates. The drive mechanism for each positioner 86 shown in FIG. 4 can be used to drive each positioner 130.

In FIG. 6B, stoppers 142 and 144 are contacted with two adjacent sides of each substrate S and rotary pushers 146 and 148 with the other two adjacent sides thereof. The stopper 142 and the pusher 146 are fixed while the stopper 144 and the pusher 148 are arranged freely movable up and down not to interfere with the substrates S.

Figure 7:
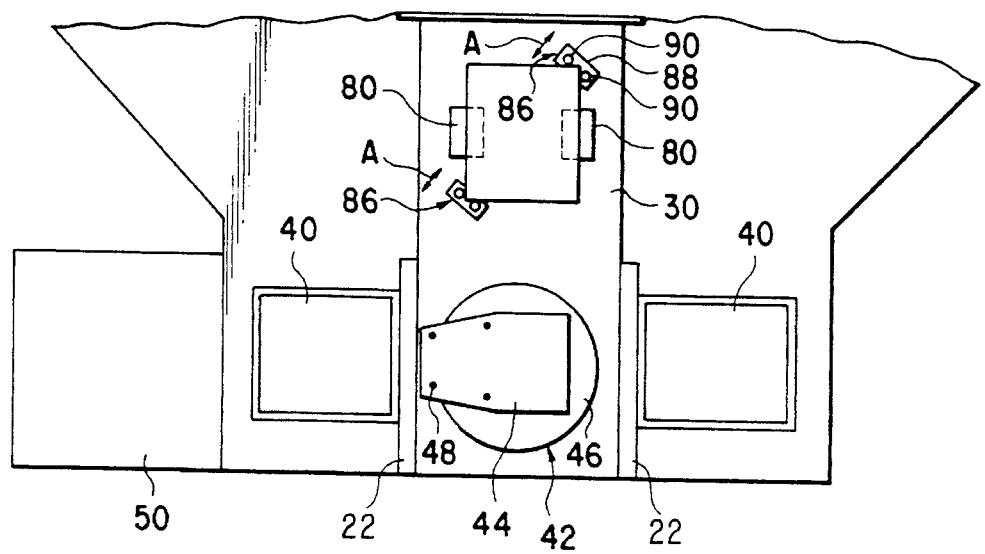
FIG. 7 shows a variation of the second load lock chamber.

As shown in FIG. 7, the carrier member 42 for carrying the substrates into and out of the cassettes 40 can be arranged in the second load lock chamber 30. The carrier member 42 and the buffer rack 80 are held in the same atmosphere and gate valves 22 are interposed between the chamber 30 and one cassette 40 and between the chamber 30 and the other cassette 40 in this case.

As shown in FIGS. 9 and 10, a multi-chamber system (or plasma-processing system) 200 has three process chambers 201,202 and 203, which are connected to a carrier chamber (or first load lock chamber) 207 through gate valves 204,205 and 206, respectively. These process chambers 201,202 and 203 are arranged on both sides of the carrier chamber 207 and on the rear side thereof. When the gate valves 204,205 and 206 are opened, the process chambers 201,202 and 203 are communicated with the carrier chamber 207 through them. A second load lock chamber 210 is arranged on the front side of the first load lock chamber 207. LCD substrates P are carried into the first load lock chamber 207 through the second load lock chamber 210.

In this multi-chamber system 200, two process chambers 201 and 202 can be used for etching process and the remaining one 203 for ashing process. Or all of them can be used for etching or ashing process. In short, the multi-process system 200 enables its designing to be made freer.

The carrier arm 60 and the buffer frame 70 shown in FIG. 1 are arranged in the carrier chamber 207. The buffer rack 80 shown in FIG. 1 is arranged in the second load lock chamber 210.

Gate valves 208 and 209 are arranged on the rear and front sides of the second load lock chamber 210. When the gate valve 208 is opened, the load lock chamber 210 is communicated with the carrier chamber 207 through it. When the gate valve 209 is opened, the load lock chamber 210 is made open to normal atmosphere in the clean room.

A carrier arm 230 is arranged in front of the front side gate valve 209. It is in normal atmosphere. It has two upper and lower holders 238 and 240 on which two sheets of LCD substrates P are held and carried into and out of the second load lock chamber 210. It is supported rotatable on a base 232.

Cassette indexers 290 and 291 are arranged on both sides of the base 232. They have two cassettes 294 in which the LCD substrates are housed. Each of the cassettes 294 is moved up and down by an elevator 292 and it houses therein twenty sheets of the LCD substrates, maximum. One of the indexers 290 is used for unprocessed substrates and the other for processed ones.

The elevator 292 for each of the cassette indexers 290 and 291 is controlled by a controller 270 to continuously and intermittently move up and down. More specifically, the cassette 294 in which the unprocessed LCD substrates P are housed, for example, is continuously moved upward by the elevator 292 until a top LCD substrate $P_1$ and a second LCD substrate $P_2$, next to the top one, in it are positioned a little higher than their corresponding upper and lower holders 238 and 240 of the carrier arm 230, respectively. Thereafter, the cassette 294 is intermittently moved upward by a stroke, two times the pitch at which the LCD substrates are housed in the cassette 294, every time two LCD substrates P are carried out of the cassette 294 into the second load lock chamber 210 by the carrier arm 230. When all of the LCD substrates P are carried out of the cassette 294, the cassette 294 is then continuously moved downward by the elevator 292.

Figure 11:
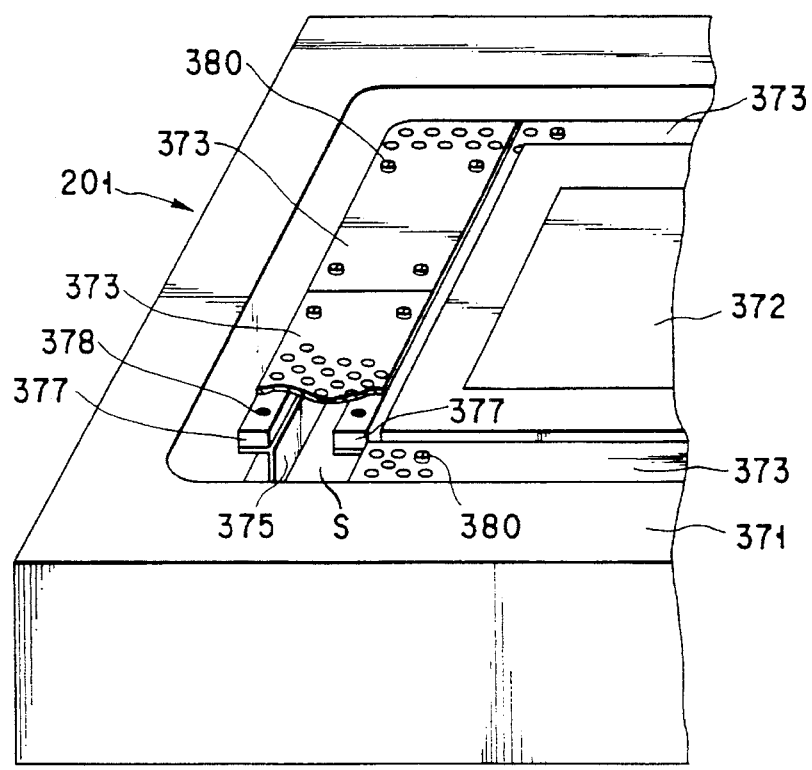
FIG. 11 is a perspective view showing the bottom portion of a process chamber dismantled.
Figure 12:
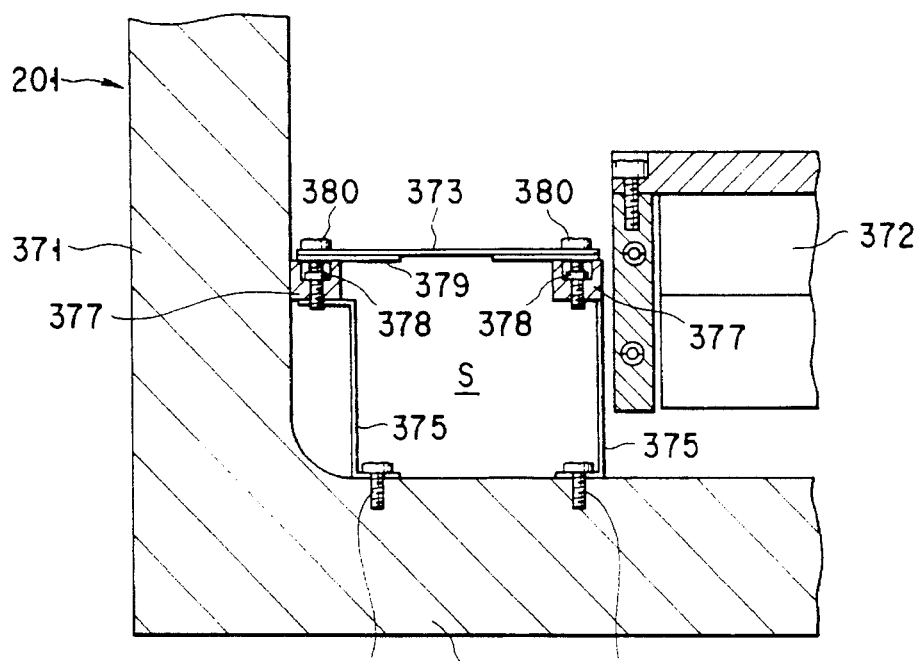
FIG. 12 is a vertically-sectioned view showing the bottom portion of the process chamber.

Referring to FIGS. 11 and 12, it will be described what base structure the first process chamber 201, for example, has.

A groove-like space S is formed between each of side walls 371 of the chamber 201 and a lower electrode 372 and it encloses the lower electrode 372. It is communicated with exhaust means (not shown) through four exhaust openings (not shown) at four corners of a chamber bottom 376 and process gas in the chamber 201 can be therefore exhausted outside through it. The lower electrode 372 is shaped like a rectangular plate.

As shown in FIG. 11, the space S is covered by plural baffle plates 373. Each baffle plate 373 is made of aluminium and it has a plurality of apertures. As shown in FIG. 12, its top is positioned a little lower than the top of the lower electrode 372. It is attached to the chamber bottom 376 through a pair of baffle supports 375, which is fixed to the chamber bottom by aluminium-made screws 374. A baffle base 377 made of ceramics is fixed to the top of each baffle support 375 by aluminium-made screws 378.

As shown in FIG. 12, grooves each having such a size that allows the head of each screw 378 to be closely fitted in it are formed in the top of each baffle base 377. The screws 378 are screwed into each baffle support 375 through the baffle base 377 to fix the baffle base 377 to the baffle support 375. The head of each screw 378 is not projected from the top of the baffle base 377.

Each baffle plate 373 are mounted on its baffle bases 377 through a reinforcing plate 379 and it is fixed to the baffle supports 375 by aluminium-made screws 380. The screws 380 are shifted from those 378 not to interfere with one another. Both side rims of each baffle plate 373 are not projected from outer side walls of the baffle bases 377 to contact neither of the chamber side wall 371 nor the lower electrode 372. All of the aluminium-made members such as the baffle plate 373 are coated with alumite.

Figure 13:
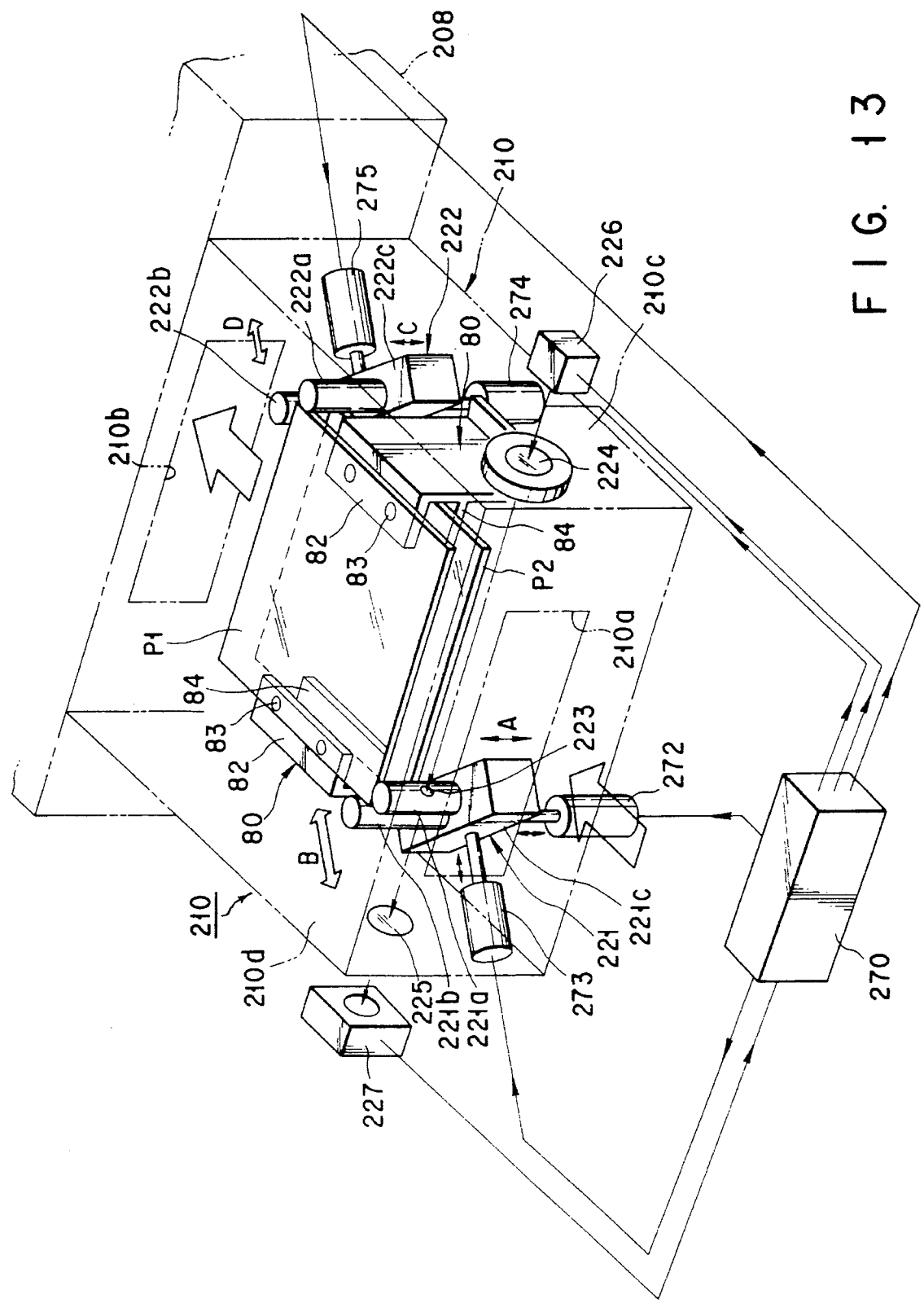
FIG. 13 is a perspective view showing a second load lock chamber.

The second load lock chamber 210 and its interior will be described with reference to FIG. 13.

Figure 3:
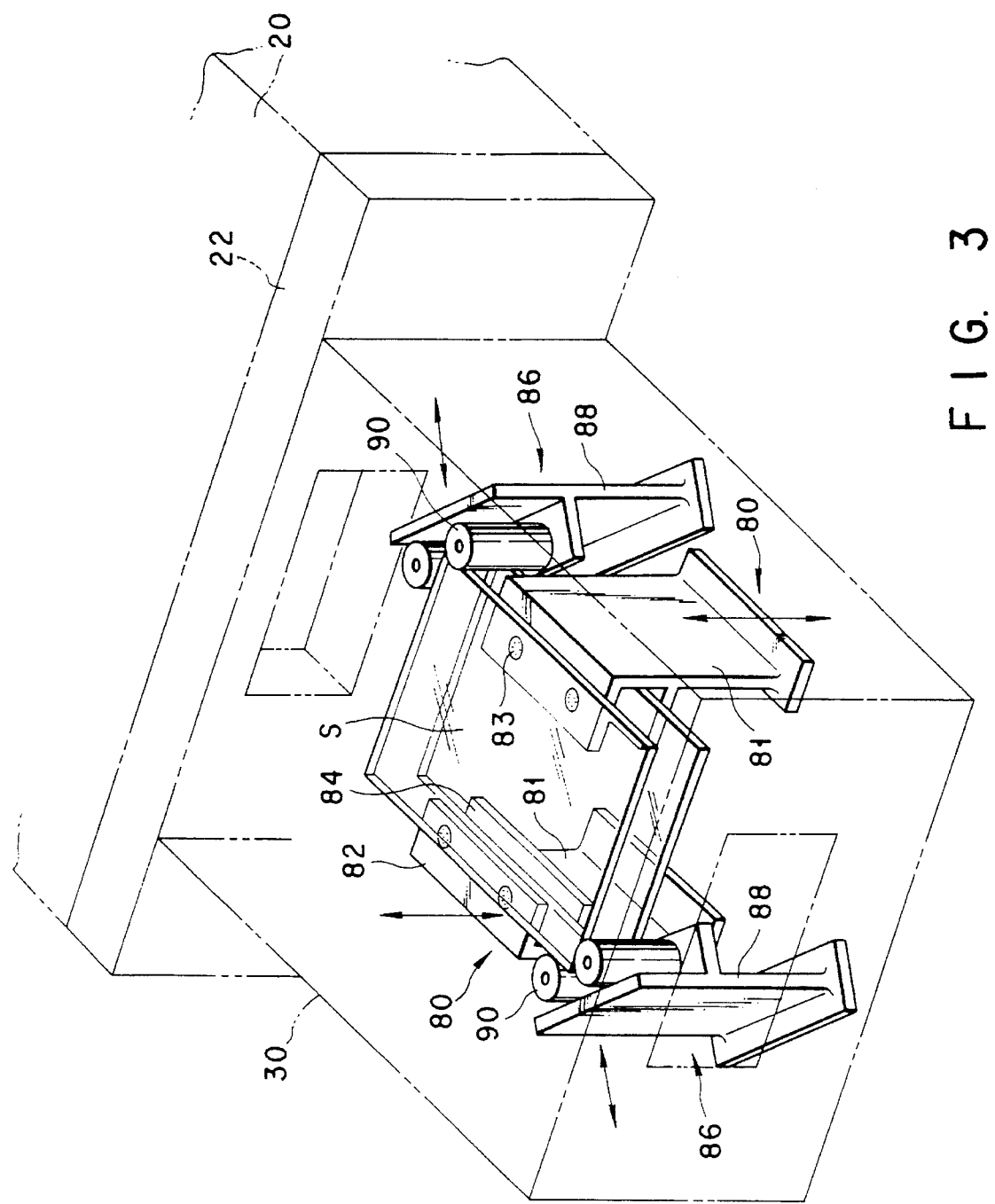
FIG. 3 is a perspective view showing a buffer rack and positioners arranged in a second load lock chamber of the apparatus shown in FIG. 1.

The second load lock chamber 210 is substantially same as the one 30 shown in FIG. 3. The load lock chamber includes inlet/outlet passages 210a, 210b and side walls 210c, 210d. A pair of buffer frames 80 are arranged in the second load lock chamber 210. They are opposed to each other and two LCD substrates $P_1$ and $P_2$ are mounted, parallel to each other in the horizontal direction, on them. They are same as those shown in FIG. 3.

A pair of positioners 221 and 222 are arranged adjacent to their corresponding buffer frames 80. One of them has two rollers 221a and 221b and the other also has two rollers 222a and 222b. The first group of the rollers 221a and 221b are supported on a base 221c, rotatable round their vertical shafts. The second group of the rollers 222a and 222b are also supported on a base 222c, rotatable round their vertical shafts.

The rollers 221a and 221b are separated a little from each other and they contact those end faces of each of the LCD substrates $P_1$ and $P_2$, which form a corner, at their outer circumferences. The rollers 222a and 222b are also separated a litter from each other and they contact those end faces of each of the substrates $P_1$ and $P_2$, which form another corner diagonal to the abovementioned one, at their outer circumferences.

The base 221c is connected to piston rods of two air cylinders 272 and 273. When the rod comes into and out of the air cylinder 272, the rollers 221a and 221b are moved up and down together with the base 221c (in directions shown by arrows A). When the rod comes into and out of the air cylinder 273, they are moved forward and backward together with the base 221c (in directions shown by arrow B). Their horizontal movements are made relative to the other positioner 222 which is on a diagonal line.

The other base 222c is also connected to rods of two air cylinders 274 and 275 and it is moved up and down (in directions shown by arrows C) and forward and backward (in directions shown by arrows D).

The rod of each of the first and second cylinders 272 and 274 has a maximum stroke of about 100 mm in the vertical direction. The rod of the first cylinder 273 has a maximum stroke of about 100 mm in the horizontal direction while the rod of the second cylinder 275 a maximum stroke of about 30 mm in the same direction. The reason why the rod of the second cylinder 275 is made shorter in stroke than that of the first cylinder 273 resides in that the first positioner 221 pushes and positions the LCD substrates P relative to the second positioner 222.

Drive sources for four air cylinders 272, 273, 274 and 275 are connected to the output side of a controller 270. On the other hand, a laser receiving section 227 is connected to the input side of the controller 270, which applies command signal to the drive sources, responsive to signal applied from the laser receiving section 227.

A photosensor used to position the LCD substrates P will be described.

The photosensor has laser shooting and receiving sections 226 and 227. The laser shooting section 226 is opposed to a window 224 in a side wall of the second load lock chamber 210. When laser is shot from the section 226, it enters into the second load lock chamber 210 through the window 224. The laser shooting section 226 is connected to the output side of the controller 270.

The laser receiving section 227 is opposed to a window 225 in that side wall of the second load lock chamber 210 which is opposed to the other window-provided side wall. Laser beam is received by the laser receiving section 227, passing through the chamber 210 and the window 225. The laser receiving section 227 is connected to the input side of the controller 270. A transparent glass plate is air-tightly fitted in each of the windows 224 and 225. A transparent acryl plate or polycarbonate plate may be used instead.

A through-hole 223 is formed in the roller 221a in the center thereof, when viewed in the longitudinal direction, passing through it in the horizontal direction. The through-hole has a diameter so large as to allow laser beam to pass through it.

The laser beam axis is set to cross the roller 221a of the first positioner 221 which is moved in vertical and horizontal directions. When the first positioner 221 is moved in the horizontal direction, laser beam is intercepted by two rollers 221a and 221b. When the roller 221a comes to a predetermined position (or predetermined positioning point), however, laser beam is allowed to pass through the through-hole 223 and reach the laser receiving section 227. When the first positioner 221 is stopped at the time, the LCD substrates P can be correctly positioned relative to the buffer frames 80. It may be arranged that laser beam which has passed through a space between two rollers 221a and 221b is received by the laser receiving section 227. A soft programming capable of distinguishing patterns of received laser beam from each other is incorporated into the controller 270 in this case. The roller 221a can be therefore distinguished from the one 221b.

In a case where each of the rollers 221a, 221b, 222a and 222b is made so long as to meet three sheets of the LCD substrates, two through-holes 223 may be formed in the first roller 221a adjacent to the top and bottom thereof.

Figure 14:
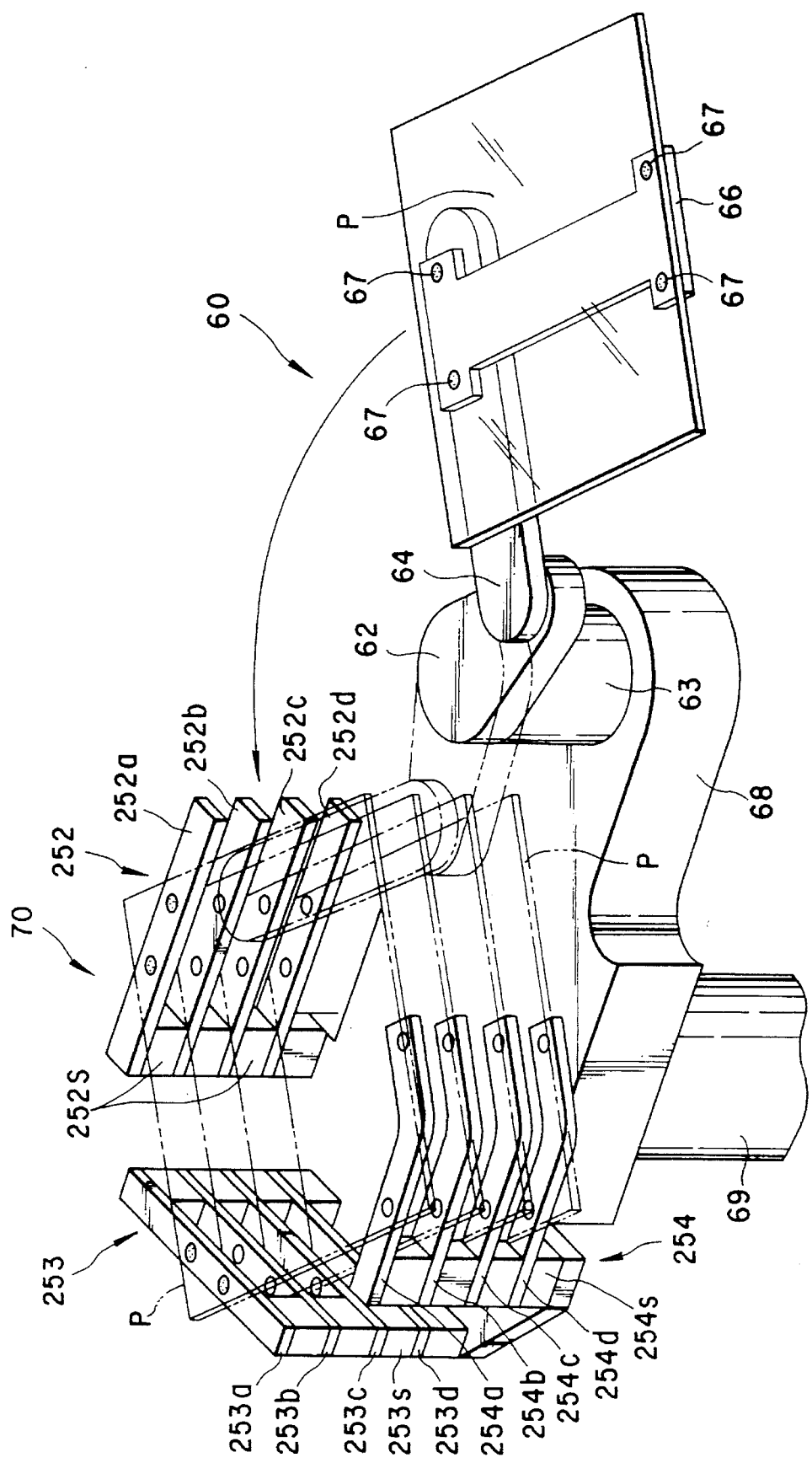
FIG. 14 is a perspective view showing a carrier arm and a buffer frame in a first load lock chamber.

The carrier arm 60 and the buffer frame 70 in the first load lock chamber 207 will be described with reference to FIG. 14. They are same as those shown in FIG. 2 and they will be described in more detail.

The carrier arm 60 and the buffer frame 70 are arranged at one end of the base 68 rotated by the arm drive 69. The carrier arm 60 includes first and second rotatable arm members 62 and 64 and the holder 66 fixed to the second arm 64.

The buffer frame 70 is arranged at the other end of the rotatable base 68. It includes three frame member groups 252, 253 and 254. The LCD substrates P are supported at their three points or corners by the three frame member groups 252, 253 and 254.

Each of the frame member groups 252, 253 and 254 includes four frame members. The frame member group 252 includes four frame member 252a, 252b, 252c and 252d, same in shape and dimension, stacked on the base 68 with spacers 252s interposed between two adjacent frame members. The frame member group 253 also includes four frame members 253a, 253b, 253c and 253d, same in shape and dimension, stacked on the base 68 with spacers 253s interposed between two adjacent frame members. The frame member group 254 also includes four frame members 254a, 254b, 254c and 254d, same in shape and dimension, stacked on the base 68 with spacers 254s interposed between two adjacent frame members. Four LCD substrates P, maximum, can be held on these frame members 252a –254d.

when arranged as described above, the LCD substrate P carried by the holder 66 of the carrier arm 60 can be held, for example, on the frame members 252b, 253b and 254b, same in level. Or it can be taken, for example, out of the frame members 252c, 253c and 254c, same in level, and carried to a predetermined position in the process chamber 201, 202 or 203, or to the buffer in the first load lock chamber 207.

The carrier arm 230 which is in normal atmosphere in the clean room will be described with reference to FIGS. 16 through 18.

The carrier arm 230 includes a holder 236 which comprises two upper and lower holder members 238 and 240. These holder members 238 and 240 are supported by slide means (not shown) such as the extensible shaft. The slide means is supported by a rotatable base 234.

The rotatable base 234 is supported by elevator means in a box 232. In short, the holder members 238 and 240 can be swung and moved up and down. The substrates P can be therefore carried to and out of any position around the box 232 by the holder members 238 and 240 of the holder 236 of the carrier arm 230.

Each of the upper and lower holder members 238 and 240 is made by an aluminium plate. An aluminium-made spacer 242 is interposed between them. These members 238, 240 and 242 are earthed.

Figure 17:
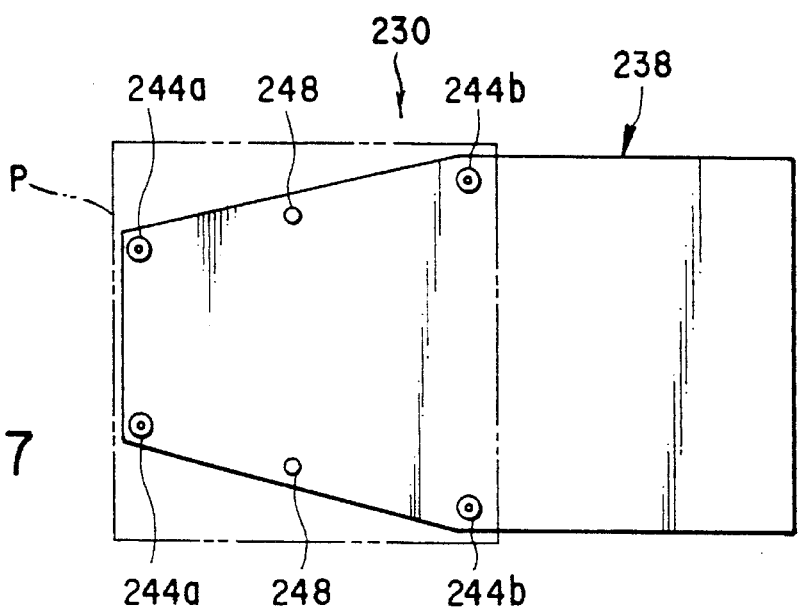
FIG. 17 is a plan view showing a holder section of the carrier arm.

As shown in FIG. 17, the upper and lower holder members 238 and 240 are substantially same and each of them comprises a trapezoidal portion on which the LCD substrate P is mounted, and a rectangular portion. Two pairs of suction pads 244a and 244b and a pair of support posts 248 are erected from the top of the trapezoidal portion of the holder member 238. The suction pads 244a are arranged at front corners of the trapezoidal portion while the other suction pads 244b on the base end side thereof. The paired support posts 248 are arranged between the paired suction pads 244a and the other paired suction pads 244b. The suction pads 244a, 244b and the support posts 248 are made of polyetheretherketone (PEEK).

When the LCD substrates P are taken out of the cassettes, carried into and out of one of the process chambers 201–203 or passed through any of the gate valves 204–206 and 208, the swinging holder 236 can be kept not to interfere with any other members.

Figure 18:
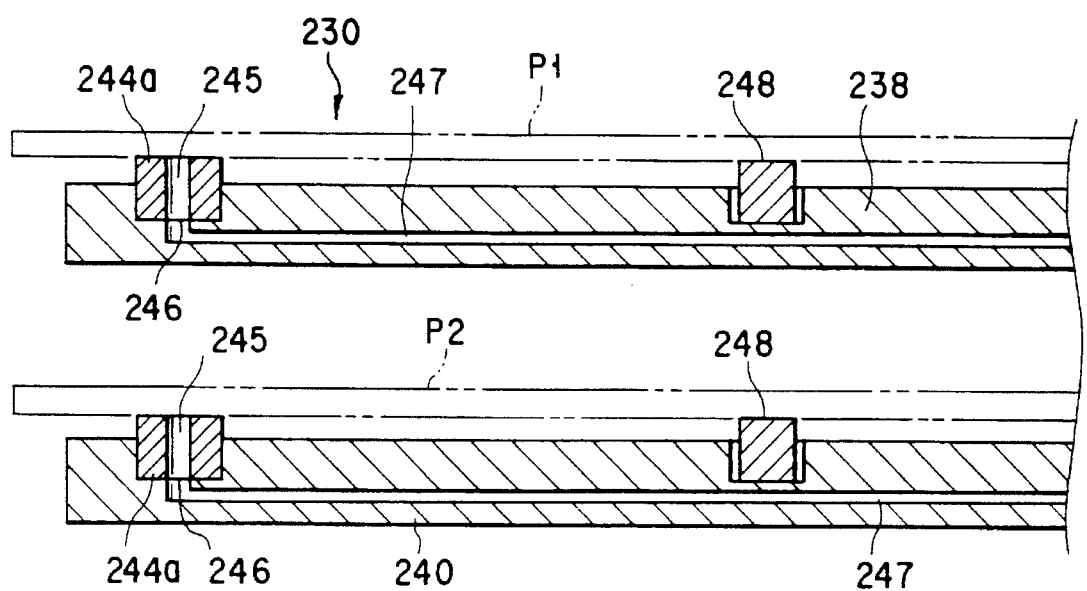
FIG. 18 is a vertically-sectioned view showing a part of the holder section of the carrier arm.

As shown in FIG. 18, the lower half of each suction pad 244a is embedded in and bonded to the holder member 238 (or 240) while the upper half thereof is projected from the top of it by about 0.5 mm.

A suction hole 245 is formed in each suction pad 244a along the center line thereof and its suction opening 246 is communicated with an internal passage 247 in the holder member 238 (or 240). The internal passage 247 extends to the pumping side of a vaccum pump (not shown). Same thing can be said about each of the other suction pads 244b.

The diameter of each support post 248 is made smaller than that of each of the suction pads 244a and 244b and it is about 5 mm, for example. The lower half of each support post 248 is embedded in and bonded to the holder member 238 (or 240) while the upper held thereof is projected from the top of it by about 0.5 mm. The interval between the upper 238 and the lower holder member 240 is same as the pitch between two adjacent LCD substrates P housed in the cassette 294.

As shown in FIG. 17, the suction pads 244a and 244b are contacted with the LCD substrate P at those points which are 10–20 mm inward from both side rims of the substrate P when the substrate P having a size of 450 mm ×500 mm is mounted on the holder member 238 (or 240).

It will be described how the above-described plasma processing system is operated.

The cassette 294 is set on the cassette indexer 290, directing its open side to the support base 231. It houses unprocessed LCD substrates P therein. It is moved upward and the top and second LCD substrates $P_1$ and $P_2$ in it are positioned same in level as the carrier arm 230. They are then taken out of it by the carrier arm 230.

The gate valve 209 is opened and the LCD substrates $P_1$ and $P_2$ are carried into the first load lock chamber 210 through it. They are mounted on the buffer frame 80. The gate valve 209 is closed and the first load lock chamber 210 is exhausted and decompressed to about $^{-1}$Torr.

The first and second positioners 221 and 222 are moved upward and then in the horizontal direction. Their rollers 221a, 221b, 222a and 222b are thus contacted with the substrates $P_1$ and $P_2$ at two opposed corners thereof on the diagonal line. The rollers 221a, 221b, 222a and 222b push the substrates $P_1$ and $P_2$ to correctly position them to be carried.

Referring to FIGS. 15A through 15C, it will be described how the LCD substrates P are positioned.

when the LCD substrates $P_1$ and $P_2$ are positioned by the first and second positioners 221 and 222 or they are pushed and held by the rollers 221a, 221b, 222a and 222 b, laser beam is shot from the laser shooting section 226 to the laser receiving section 227.

When the LCD substrates $P_1$ and $P_2$ are correctly positioned relative to their passage, as shown in FIG. 15A, the laser beam is received by the laser receiving section 227, passing through the through-hole 223 of the roller 221a. It can be thus confirmed that the LCD substrates $P_1$ and $P_2$ have been correctly positioned.

When the LCD substrates $P_1$ and $P_2$ are shifted from their predetermined positions or not present at these positions, however, laser beam is intercepted by the roller 221a. It can be thus confirmed that they are not correctly positioned relative to their passage.

When the LCD substrates $P_1$ and $P_2$ are not mounted on the buffer rack 80, as shown in FIG. 15B, the first positioner 221 moves its maximum stroke to the second positioner 222. As the result, laser beam shot from the laser shooting section 226 is intercepted by the roller 221a. When the LCD substrates $P_1$ and $P_2$ are tilted on the buffer rack 80 and the first positioner 221 cannot move to the second one 222, as shown in FIG. 15C, laser beam shot from the laser shooting section 226 is also intercepted by the roller 221a.

In any of these cases, laser beam cannot be received by the laser receiving section 227 and it can be thus confirmed that the LCD substrates $P_1$ and $P_2$ are not positioned at their predetermined positions.

It may be displayed by the CRT device, which is usually used by the plasma processing system of this kind, whether or not the LCD substrates $P_1$ and $P_2$ are correctly positioned.

When the LCD substrates $P_1$ and $P_2$ are correctly positioned, they are carried into the carrier chamber 207 and then into the process chambers 201–203 by the carrier arm 60. They are etching- and ashing-processed in them.

As apparent from the above, laser beam is not shot to the LCD substrates $P_1$ and $P_2$. In addition, laser beam received is neither penetrated nor reflected one. Therefore, the LCD substrates $P_1$ and $P_2$ can be more reliably and accurately detected whatever material they may be made of and whatever state their surfaces may be kept under.

Further, each of the rollers 221a, 221b, 222a and 222b is made longer than the interval between the LCD substrates $P_1$ and $P_2$ mounted on the buffer racks 80. This enables two of the substrates $P_1$ and $P_2$ to be positioned at the same time.

When the buffer racks 80 have three buffers to hold three sheets of the LCD substrates thereon at the same time, each of the rollers 221a, 221b, 222a and 222b is image longer than the interval between the top and the bottom LCD substrate in the racks 80 and the positioners 221 and 222 are moved up and down (or in the directions shown by arrows A and C in FIG. 13) by a larger stroke. When so arranged, three sheets of the LCD substrates can be positioned at the same time.

When each of the rollers 221a, 221b, 222a and 222b is made so long as to meet three sheets of the LCD substrates, as described above, the positioning of two LCD substrates can also be attained by adjusting the stroke of the positioners 221 and 222 moved up and down. This enhances the feasibility of the system.

The second positioner 222 serves as a fixed member at the substrate-positioning time but it may be moved in the horizontal direction.

The LCD substrates $P_1$ and $P_2$ in the second load lock chamber 210 may be sometimes shifted from their predetermined positions by the flow of air caused when the chamber 210 is exhausted. However, this shifting of them can be corrected by the positioners 221 and 222. Recently, the LCD substrates become larger and larger in size. The positioners 221 and 222, however, can correctly positioned them even if they should be shifted from their predetermined positions.

The positioning of the LCD substrates may be finished before they are carried into the first load lock chamber 207. The LCD substrates $P_1$ and $P_2$, therefore, may be positioned while exhausting the second load lock chamber 210. They can be firmly held by the rollers 221a, 221b, 222a and 222b even in this case. Therefore, they are neither shifted from their predetermined positions nor dropped from the buffer racks 80 by the flow of air caused when the second load lock chamber 210 is exhausted.

The LCD substrate $P_2$ which has been etching-processed is carried into the process chamber 203 and ashing-processed in it.

The remaining unprocessed LCD substrate $P_3$ is then carried into the second load lock chamber 210 and mounted on the top frame members 252a, 253a and 254a of the buffer frame 70. Next LCD substrates $P_5$ and $P_6$ are carried into the first load lock chamber 207.

The LCD substrate $P_1$ which has been etching-processed in the process chamber 202 is held on the lowermost frame members 252d, 253d and 254d of the buffer frame 70. The LCD substrate $P_3$ is carried instead into the process chamber 202 and etching-processed in it.

The LCD substrate $P_3$ which has been ashing-processed in the process chamber 203 is held on the second frame members 252b, 253b and 254b of the buffer frame 70. The LCD substrate $P_1$ which has been etching processed is ashing-processed instead in the process chamber 203.

The LCD substrate $P_1$ which has been ashing-processed is then held on the third frame members 252c, 253c and 254c of the buffer frame 70.

In the buffer frame 70 of this example, its top frame members 252a, 253a and 254a provide a place at which the LCD substrate is kept waiting before it is carried into the process chamber 201 or 202. Its second and third frame members 252b, 253b, 254b and 252c, 253c, 254c provide places where the LCD substrates which have been ashing-processed in the process chamber 203 are kept waiting. And its bottom frame members 252d, 253d and 254d provide a place at which the LCD substrate which has been etching-processed in the process chamber 201 or 202 is kept waiting before it is ashing-processed.

The lower one $P_6$ of the LCD substrates $P_5$ and $P_6$ in the second load lock chamber 210 which are to be processed next is held on the top frame members 252a, 253a and 254a of the buffer frame 70. The LCD substrate $P_2$ which has been ashing-processed at first and held on the second frame members 252b, 253b and 254b of the buffer frame 70 is carried instead into the second load lock chamber 210. The LCD substrate $P_6$ is carried from the top frame members 252a, 253a and 254a into the process chamber 201 and the LCD substrate $P_5$ in the second load lock chamber 210 is then held on the frame members 252a, 253a, and 254a. The LCD substrate $P_1$ which has been ashing-processed is carried to the upper buffers of the buffer racks 80 on which the LCD substrate $P_5$ was held till then.

The LCD substrate $P_1$ is held on the upper buffers of the buffer racks 80 while the LCD substrate $P_2$ on the lower buffers thereof in the second load lock chamber 210, as described above. The LCD substrates $P_1$ and $P_2$ finally processed can be therefore held in a same positional relation as when they are carried into second load lock chamber 210.

The finally-processed LCD substrates $P_1$ and $P_2$ are carried out of the second load lock chamber 210 and housed in the cassette 294 by the carrier arm 230. In this case, the substrate $P_1$ is held on the upper buffers and the other substrate $P_2$ on the lower buffers in the second load lock chamber 210, as described above. Therefore, they can be housed in the cassette 294 in the order of $P_1$, $P_2$, - - - when they are counted from the top to the bottom of the cassette 294.

When the LCD substrates $P_1$ and $P_2$ are housed in the cassette 294, the cassette 294 is lifted by the cassette indexer 290 to house the next LCD substrates $P_3$ and $P_4$.

As apparent from the above, the cassette 294 on the cassette indexer 290 is exchanged with a new one in which a next group of unprocessed substrates is housed, at the time when the last two LCD substrates $P_{13}$ and $P_{14}$ housed in the cassette 294 then held on the cassette indexer 290 are carried into the second load lock chamber 210. On the other hand, the cassette 294 on the cassette indexer 291 is exchanged with a new empty one at the time when the LCD substrate $P_{13}$ and $P_{14}$ finally processed are housed in the cassette 294 then held on the cassette indexer 291. This enables the LCD substrates to be processed with an extremely higher efficiency. The cassettes can be more quickly exchanged with new ones to thereby enhance the throughput of the system.

Further, the time needed to ashing-process the LCD substrates of this kind is two times the time needed to etching-process them. It takes two minutes, for example. When the LCD substrates P are carried and kept waiting as described above, however, the process chambers 201,202 and 203 can be more efficiently used to thereby make the throughput of the system extremely higher.

The inventors practically processed the LCD substrates by this multi-chamber system. As the result, 500 sheets of them could be processed per 16 hours. This is an extremely higher throughput never seen in the case of the conventional systems.

The ceramics-made baffle bases 377 are used to fix the baffle plates 373 to the baffle supports 375, that is, to any of the etching- and ashing-process chambers 201,202 and 203. Different from the conventional fixing of the baffle plates, this can provide an extremely higher and more stable insulation effect relative to walls of the process chamber 210, for example.

Even if surfaces of the baffle plates 373 and the aluminium-made screws 378 are degraded in insulation by friction and others caused when attaching and detaching of the baffle plates are conducted relative to the process chamber 201, for example, every time the final process is finished relative to a predetermined batch of the LCD substrates P, the insulation of the baffle plates 373 relative to the process chamber 201 can be kept enough by the baffle bases 377. This prevents abnormal discharge, which was conventionally seen when the baffle plates of this kind were used, from being caused. More stable etching and ashing processes can be thus realized.

Still further, gas in the process chamber 201 is exhausted outside through four exhaust openings at the four bottom corners of the process chamber 201. This cooperates with a plurality of apertures in the baffle plates 373 to make the gas-exhaust extremely uniform. Processes applied to the LCD substrates can be thus made more uniform and stable.

Although the process chambers 201 and 202 have been used for etching and the process chamber 203 for ashing in the above-described example, all of them may be used for etching or ashing. Or processes conducted in the process chambers 201,202 and 203 may be different from one another and continuously conducted in them. Even in these cases, an extremely high throughput can be realized.

Still further, it may be arranged that the number of LCD substrates which can be carried in normal atmosphere by the carrier arm 230 and held in the second load lock chamber 210 is increased to three and that the buffer frame 70 in the first load lock chamber 207 is arranged to meet this increased number of LCD substrates.

Still further, the suction pads 244a and 244b are made of PEEK which is extremely stable as material and excellent in chemical- and friction-resistance and also in mechanical property. As compared with the conventional O-rings made of silicon rubber, therefore, the amount of particles caused can be reduced to greater extent.

Still further, the support posts 248 are also made of PEEK. Even when the LCD substrate P has a large size of 450 mm ×500 mm and its center portion tends to bend because of its own weight, therefore, it can be supported by the support posts 248 not to contact the holder member 238 or 240 at its underside and also not to provide any clearance between each of the suction pads 244a, 244b and it. Even when the LCD substrates P are made large in size, therefore, they can be more stably carried in the system at a higher speed.

Still further, the carrier arm 230 is earthed. Even if it should be charged, therefore, it cannot attract any of floating particles. This prevents matters carried from being contaminated.

The LCD substrate P on the holder member 238 or 240 can be vacuum-sucked and firmly held by the four suction pads 244a and 244b. This enables the LCD substrate P to be carried in the system at high speed. In addition, the positional shifting of the LCD substrate P can be prevented even at the time when the carrier arm 230 is started and stopped.

Still further, the top of the support base 231 is made lower than that of the second load lock chamber 210. Maintenance work can be thus more easily added to the carrier arm 230 in normal atmosphere.

The present invention can be effectively applied to the vacuum processing apparatus which is provided with a single vacuum process chamber. It can also be applied to other various vacuum processing apparatuses, such as a film forming apparatus, as well as the etching and ashing apparatus described above.

What is claimed is:

1. A multi-chamber system for processing substrates comprising:

plural vacuum-process chambers in which substrates are processed in a decompressed atmosphere;

a first load lock chamber communicated with each of the vacuum-process chambers and exhausted to substantially the same decompressed atmosphere as the vacuum-process chambers;

a second load lock chamber communicated with the first load lock chamber and exhaustible to substantially the same atmosphere as the first load lock chamber;

first carrier means arranged in the first load lock chamber to carry a substrate between the first load lock chamber and the second load lock chamber;

first buffer means arranged in the first load lock chamber to temporarily hold plural substrates thereon;

second buffer means arranged in the second load lock chamber to temporarily hold plural substrates thereon;

positioning means arranged in the second load lock chamber to position single or plural substrates; and second carrier means arranged in a non-decompressed atmosphere to carry plural substrates into and out of the second load lock chamber.

2. The multi-chamber system according to claim 1, wherein said substrate is a LCD rectangular glass substrate.

3. The multi-chamber system according to claim 1, wherein said substrate is a LCD rectangular glass substrate carried in the system while keeping a main surface substantially horizontal.

4. The multi-chamber system according to claim 2, wherein said positioning means includes:

a photosensor for shooting a laser beam from a laser shooting section to a laser receiving section;

a pair of first rollers for contacting a first corner of peripheral face of each of the substrates;

a pair of second rollers for contacting a second corner of the peripheral face of each of the substrates, which is opposed to the first corner on a diagonal line;

a through-hole formed in at least one of the first pair of rollers to allow the laser beam shot from the laser shooting section to pass through said through-hole;

movement means for moving the first rollers toward the second rollers; and means for confirming that the substrates are correctly positioned when the laser beam which has passed through the through-hole in the at least one of the first pair of rollers is received by the laser receiving section.

5. The multi-chamber system according to claim 4, further comprising second movement means for moving the second rollers toward the first rollers.

6. The multi-chamber system according to claim 4, further comprising a pair of windows formed in opposed side walls of the second load lock chamber, wherein the laser shooting section is arranged to shoot the laser beam into the second load lock chamber through one of the windows and the laser receiving section is arranged to detect the laser beam coming from the second load lock chamber through the other window.

7. The multi-chamber system according to claim 1, wherein said second carrier means includes a holder section for holding the substrates thereon; suction pads erected from the top of the holder section and for contacting a main surface of the substrate; and exhaust means communicating with a through-hole formed in each suction pad.

8. The multi-chamber system according to claim 7, wherein the suction pads are made of polyetheretherketone.

9. The multi-chamber system according to claim 7, further comprising plural support posts disposed on said second carrier means, said support posts made of polyetheretherketone to support the substrate thereon.

10. The multi-chamber system according to claim 7, wherein said holder section includes two holder members arranged parallel to each other to hold two substrates thereon.

11. The multi-chamber system according to claim 1, further comprising cassette means arranged adjacent to the second carrier means to house plural substrates therein.

12. The multi-chamber system according to claim 11, further comprising elevator means for moving the cassette means up and down.

13. The multi-chamber system according to claim 1, further comprising stopper members formed on a substrate mounting face of said first carrier means to prevent the substrate from sliding on the first carrier means.

14. The multi-chamber system according to claim 1, wherein said first buffer means supports each substrate at three corners thereof.

* * * * *